(12) United States Patent
Kim et al.

(10) Patent No.: US 10,961,450 B2
(45) Date of Patent: Mar. 30, 2021

(54) METAL FLUORIDE RED PHOSPHOR AND LIGHT EMITTING ELEMENT USING SAME

(71) Applicant: KOREA RESEARCH INSTITUTE OF CHEMICAL TECHNOLOGY, Yuseong-gu Daejeon (KR)

(72) Inventors: Chang Hae Kim, Sejong (KR); Bo Geuk Bang, Gyeongsangbuk-do (KR); Kang Sik Choi, Daejeon (KR); June Kyu Park, Nam-gu Daegu (KR); Min Seuk Kim, Seoul (KR); Kee Sun Sohn, Seoul (KR)

(73) Assignee: KOREA RESEARCH INSTITUTE OF CHEMICAL TECHNOLOGY, Daejeon (KR)

( * ) Notice: Subject to any disclaimer, the term of this patent is extended or adjusted under 35 U.S.C. 154(b) by 356 days.

(21) Appl. No.: 15/762,619

(22) PCT Filed: Sep. 22, 2016

(86) PCT No.: PCT/KR2016/010596
§ 371 (c)(1),
(2) Date: Mar. 23, 2018

(87) PCT Pub. No.: WO2017/052234
PCT Pub. Date: Mar. 30, 2017

(65) Prior Publication Data
US 2018/0265780 A1 Sep. 20, 2018

(30) Foreign Application Priority Data

Sep. 23, 2015 (KR) .................. 10-2015-0134405
Sep. 20, 2016 (KR) .................. 10-2016-0119738

(51) Int. Cl.
*C09K 11/67* (2006.01)
*C09K 11/57* (2006.01)
(Continued)

(52) U.S. Cl.
CPC ............ *C09K 11/675* (2013.01); *C09K 11/57* (2013.01); *C09K 11/616* (2013.01);
(Continued)

(58) Field of Classification Search
CPC ..... C09K 11/675; C09K 11/57; C09K 11/616; C09K 11/617; H01L 33/502; H01L 33/504
See application file for complete search history.

(56) References Cited

U.S. PATENT DOCUMENTS 7,497,973 B2  3/2009  Radkov et al.
8,057,706 B1  11/2011  Setlur
(Continued)

FOREIGN PATENT DOCUMENTS

CN   106336866 A    1/2017
JP   2007-535615 A  12/2007
(Continued)

OTHER PUBLICATIONS

International Search Report dated Jan. 3, 2017 for PCT/KR2016/010596.
(Continued)

*Primary Examiner* — C Melissa Koslow
(74) *Attorney, Agent, or Firm* — Paul D. Bianco; Gary S. Winer; Fleit Intellectual Property Law

(57) ABSTRACT

The present invention relates to a metal fluoride red phosphor and an application of the phosphor as a light emitting element, the metal fluoride red phosphor having a tetragonal crystal structure of a novel composition, and emitting light in the red color wavelength by being excited by ultraviolet rays or a blue excitation source, thereby being usefully applicable to a light emitting element such as a light emitting
(Continued)

diode, a laser diode, a surface emitting laser diode, an inorganic electroluminescence element, and an organic electroluminescence element.

5 Claims, 10 Drawing Sheets

(51) Int. Cl.
H05B 33/14 (2006.01)
C09K 11/61 (2006.01)
C09K 11/66 (2006.01)
C09K 11/77 (2006.01)
H01L 33/50 (2010.01)

(52) U.S. Cl.
CPC .......... *C09K 11/617* (2013.01); *C09K 11/664* (2013.01); *C09K 11/7734* (2013.01); *C09K 11/7774* (2013.01); *H05B 33/14* (2013.01); *H01L 33/502* (2013.01)

(56) References Cited

U.S. PATENT DOCUMENTS

| | | | |
|---|---|---|---|
| 8,252,613 | B1 | 8/2012 | Lyons |
| 8,491,816 | B2* | 7/2013 | Hong ............... C09K 11/616 252/301.4 H |
| 8,890,403 | B2 | 11/2014 | Sakuta |
| 9,293,666 | B2 | 3/2016 | Lee et al. |
| 9,490,401 | B2 | 11/2016 | Lee et al. |
| 9,549,442 | B1* | 1/2017 | Bong ..................... F21K 9/20 |
| 10,301,541 | B2 | 5/2019 | Park et al. |
| 10,781,368 | B2 | 9/2020 | Park et al. |
| 2006/0027785 | A1 | 2/2006 | Wang |
| 2006/0028117 | A1 | 2/2006 | Cho et al. |
| 2006/0169998 | A1 | 8/2006 | Radkov |
| 2009/0072196 | A1 | 3/2009 | Cho et al. |
| 2013/0264937 | A1 | 10/2013 | Sakuta et al. |
| 2014/0268655 | A1 | 9/2014 | Murphy et al. |
| 2015/0054400 | A1 | 2/2015 | Murphy |
| 2015/0162506 | A1 | 6/2015 | Lee et al. |
| 2015/0364659 | A1* | 12/2015 | Setlur ................. C09K 11/7774 257/98 |
| 2016/0133799 | A1* | 5/2016 | Park ..................... H01L 33/502 257/98 |
| 2017/0198218 | A1* | 7/2017 | Kim ..................... C09K 11/617 |

FOREIGN PATENT DOCUMENTS

| | | |
|---|---|---|
| JP | 2009-528429 A | 8/2009 |
| JP | 2012-104814 A | 5/2012 |
| JP | 2013-533363 A | 8/2013 |
| JP | 2015-084327 A | 4/2015 |
| KR | 1004564300000 B | 11/2004 |
| KR | 10-2006-0013116 A | 2/2006 |
| KR | 1006052110000 B | 7/2006 |
| KR | 1020120115129 A | 10/2012 |
| KR | 1020120117577 A | 7/2013 |
| KR | 1020110048837 A | 8/2013 |
| KR | 10-2014-0019400 | 2/2014 |
| KR | 10-2015-0067588 A | 6/2015 |
| WO | 2012/015581 A1 | 2/2012 |
| WO | 2012/128837 A1 | 9/2012 |

OTHER PUBLICATIONS

Written Opinion for PCT/KR2016/010596 filed Sep. 22, 2016.
Hoang-Duy Nguyen et al, "Synthesis of Na2SiF6:Mn4+ red phosphors for white LED applications by co-precipitation", 2014, vol. 2, pp. 10268-10272, Journal of Materials Chemistry C.
Sadao Adachiz et al., "Direct Synthesis of K2SiF6:Mn4+ Red Phosphor from Crushed Quartz Schist by Wet Chemical Etching", 2009, vol. 12, J20-J23, Electrochemical and Solid-State Letters.
Lifen Lv et al, "Optimized photoluminescence of red phosphor K2TiF6:Mn4+ synthesized at room temperature and its formation mechanism", 2015, vol. 3, pp. 1935-1941, Journal of Materials Chemistry C.
Maxim Molokeev et al: "Reconstructive phase transition in (NH 4) 3 TiF 7 accompanied by the ordering of TiF 6 octahedra". Acta Crystallographica Section B Structural Science. Crystal Engineering and Materials. vol. 1. 70. No. 6. Jan. 1, 2014 (Jan. 1, 2014), pp. 924-931, XP055519905. DOI: 10.1107/S2052520614021192.
Written Opinion for PCT/KR2016/010596 filed Sep. 22, 2016 (English translation).
International Preliminary Report on Patentability for PCT/KR2016/010596 filed Sep. 22, 2016.
European Search Report and Opinion for European Patent Application No. 16848959, dated Mar. 25, 2019 (English translation) (related application).
S. V. Mel'nikova et al, Sequence of phase transitions in (NH4)3SiF7, : Dalton Trans., 2017, 46, 2609, 9 pages Dalton Transactions, This journal is © The Royal Society of Chemistry 2017.
S. V. Mel'nikova et al, A non-typical sequence of phase transitions in (NH4)3GeF7: optical and structural characterization, 7 pages, Dalton Transactions, This journal is © The Royal Society of Chemistry 2016.

\* cited by examiner (a) (b)

(a) (b)

METAL FLUORIDE RED PHOSPHOR AND LIGHT EMITTING ELEMENT USING SAME

TECHNICAL FIELD

The present invention relates to a metal fluoride red phosphor having a tetragonal crystal structure with a novel composition that is excited by ultraviolet or blue excitation source and emits light with a red-based wavelength, and is thus usefully applicable to a light emitting element such as a light emitting diode, a laser diode, a surface emitting laser diode, an inorganic electroluminescent element and an organic electroluminescent element, and application of the phosphor to a light emitting element.

BACKGROUND ART

White light emission diodes (LEDs) are next-generation light emitting elements which receive great attention owing to advantages of lower power consumption, higher luminous efficacy, higher brightness and higher response speed than conventional light sources.

Methods of manufacturing white light emission diodes may be broadly classified into two methods.

The first method is to manufacture white light emitting elements using red, blue and green light emitting diodes. White light emitting diodes manufactured by the first method have considerably excellent color rendering index (CRI) and optical properties, but their use is restricted only to certain lighting devices such as medical devices due to high manufacturing costs and technical problems of requiring independent operation of respective LEDs.

The second method, which is commercially available at the moment, is to manufacture white light emitting elements using binary systems for applying yellow phosphors to blue light emitting diode chips. Such a binary system involves a low manufacturing cost because white light emitting diodes having excellent optical properties can be formed with a simple structure, but has a drawback of low color rendering index (CRI) due to lack of emission of red areas. In addition, disadvantageously, various phosphors that have excellent optical properties when excited at about 450 nm have not been developed.

In response to this, recently, a variety of research has been made in order to develop phosphors that emit under an excitation condition of 450 nm.

Korean Patent Laid-open No. 10-0456430 (Patent Document 1) discloses a white light emitting element using a binary system to apply YAG:Ce yellow phosphors to GaN light emitting diode chips that emit blue light at a wavelength of 460 nm. However, yttrium aluminum garnet ($Y_3Al_5O_{12}$, YAG)-based phosphors have a drawback of failing to provide excellent color rendering properties due to relatively weak luminous intensity of red areas resulting from characteristics of light emission wavelengths and of being unsuitable as lighting and LED color background light sources due to sensitivity to color temperature.

In addition, Korean Patent Laid-open No. 10-0605211 (Patent Document 2) discloses a method of manufacturing white light emitting elements by applying a silicate-based green phosphor of $L_2SiO_4$:Eu (wherein L represents an alkaline earth metal selected from Mg, Ca, Sr and Ba) onto InGaN light emitting diode chips. However, the method using green light emission phosphors also has a drawback of low color rendering index (CRI) due to lack of red light emission areas.

In an attempt to solve the aforementioned problem, PCT Publication WO 2012-128837 (Patent Document 3) discloses a phosphor having a composition represented by the following Formula I.

$$A_x[MF_y]:Mn^{4+} \qquad \text{[Formula I]}$$

wherein A is selected from Li, Na, K, Rb, Cs and a combination thereof, M is selected from Si, Ge, Ti, Zr, Al, Ga, In, Sc, Y, La, Nb, Ta, Bi, Gd and a combination thereof, x is an absolute value determined by the charge of $MF_y$ ion and y is 5, 6 or 7.

Patent Document 3 discloses an example of manufacturing $K_2SiF_6$:$Mn^{4+}$ phosphors in detail, but does not suggest synthesis of $A_3MF_7$:$Mn^{4+}$ phosphors.

From conventional technologies reviewed above, it can be seen that metal fluoride phosphors containing manganese (Mn) as a lubricant are useful for manufacturing white light emitting elements due to strong red light emission intensity. The present invention focuses on manufacture of red light-emission metal fluoride phosphors using, as a raw material, $A_2MF_6$:$Mn^{4+}$ phosphors disclosed in Patent Document 3.

PRIOR ART

Patent Document (Patent Document 1) Korean Patent Laid-open No. 10-0456430
(Patent Document 2) Korean Patent Laid-open No. 10-0605211
(Patent Document 3) PCT WO 2012-128837

DISCLOSURE

Technical Problem

The present invention has been made in view of the above problems, and the objective of the present invention to provide a novel metal fluoride red phosphor that has a light emission peak in a red region by an ultraviolet or blue excitation source.

In particular, for the first time, the present inventors synthesized the metal fluoride red phosphors provided by the present invention, which had not been synthesized before, and identified that the crystal structure of the phosphors is a tetragonal structure.

Another objective of the present invention is to provide a method for manufacturing novel metal fluoride red phosphors by solid state reaction or liquid state reaction using phosphors disclosed in Patent Document 3 as a raw material.

Another objective of the present invention is to provide a white light emitting element including the novel metal fluoride red phosphor.

Technical Solution

In accordance with the present invention, the above and other objectives can be accomplished by the provision of a metal fluoride red phosphor having a composition represented by Formula 1 below:

$$A_3MF_7:Mn_x^{4+} \qquad \text{[Formula 1]}$$

wherein A is selected from K, Rb, $NH_4$ and a combination thereof; M is a metal element selected from Si, Ge, Ti and a combination thereof; and x satisfies $0 < x \le 0.15$.

In one embodiment of the present invention, the metal fluoride red phosphor is a metal fluoride red phosphor of Formula 1 wherein A is potassium (K) and M is silicon (Si) or titanium (Ti).

In one embodiment of the present invention, the metal fluoride red phosphor has a composition of Formula 1 and a tetragonal crystal structure.

In one embodiment of the present invention, the metal fluoride red phosphor has a composition of $K_3SiF_7:Mn_x^{4+}$ and a tetragonal crystal structure including, as a main phase, a phase having a diffraction peak with a relative intensity of 5% or higher within a range of Bragg's angle (2θ) of 28.60±0.50, 32.70±0.50, 26.69±0.50, 41.62±0.50 and 46.51±0.50° in a powder X-ray diffraction pattern.

In one embodiment of the present invention, the metal fluoride red phosphor has a composition of $(NH_4)_3SiF_7:Mn_x^{4+}$ and a tetragonal crystal structure including, as a main phase, a phase having a diffraction peak with a relative intensity of 5% or higher within a range of Bragg's angle (2θ) of 15.57±0.50, 21.79±0.50, 26.90±0.50, 31.45±0.50 and 39.71±0.50° in a powder X-ray diffraction pattern.

In one embodiment of the present invention, the metal fluoride red phosphor has a composition of $(NH_4)_3GeF_7:Mn_x^{4+}$ and a tetragonal crystal structure including, as a main phase, a phase having a diffraction peak with a relative intensity of 5% or higher within a range of Bragg's angle (2θ) of 15.25±0.50, 21.31±0.50, 26.31±0.50, 30.78±0.50, and 43.40±0.50° in a powder X-ray diffraction pattern.

In one embodiment of the present invention, the metal fluoride red phosphor has a composition of $Rb_2KSiF_7:Mn_x^{4+}$ and a tetragonal crystal structure including, as a main phase, a phase having a diffraction peak with a relative intensity of 5% or higher within a range of Bragg's angle (2θ) of 27.45±0.50, 32.09±0.50, 36.00±0.50, 40.57±0.50 and 45.38±0.50° in a powder X-ray diffraction pattern.

In one embodiment of the present invention, the metal fluoride red phosphor has a composition of $K_3TiF_7:Mn_x^{4+}$ and a tetragonal crystal structure including, as a main phase, a phase having a diffraction peak with a relative intensity of 5% or higher within a range of Bragg's angle (2θ) of 18.50±0.50, 25.50±0.50, 27.50±0.50, 28.50±0.50, and 45.00±0.50° in a powder X-ray diffraction pattern.

In one embodiment of the present invention, the metal fluoride red phosphor has a composition of the Formula 1 wherein the excitation wavelength may be 365 to 480 nm and the central emission wavelength may be 610 to 670 nm.

In accordance with another aspect of the present invention, provided is a method for manufacturing a metal fluoride red phosphor by solid state reaction including the following steps 1, 2 and 3:

(step 1) weighing a raw material containing an A precursor, an M precursor and a manganese (Mn) precursor, and physically mixing the material;

(step 2) drying the raw material mixture in an oven at 80 to 150° C.; and (step 3) heat-treating the dried mixture at 100 to 500° C. under a hydrogen gas, a nitrogen gas or a gas mixture thereof to prepare the metal fluoride red phosphor having a composition ratio represented by Formula 1.

In accordance with another aspect of the present invention, provided is a method for manufacturing a metal fluoride red phosphor by liquid state reaction including the following steps i, ii, iii and iv:

(step i) weighing a raw material containing an A precursor, an M precursor and a manganese (Mn) precursor, and dissolving the material in an acid;

(step ii) distilling, under reduced pressure, the acidic solution in which the raw material is dissolved, to obtain a solid;

(step iii) drying the obtained solid in an oven at 80 to 150° C.; and (step iv) heat-treating the dried solid at 200 to 1,000° C. under a hydrogen gas, a nitrogen gas or a gas mixture thereof to manufacture the metal fluoride red phosphor having a composition ratio represented by the Formula 1.

Effects of the Invention

Although the chemical composition formula of the metal fluoride red phosphor according to the present invention has been vaguely disclosed in the prior art, there is no research that has reported synthesis of the phosphors to date. The metal fluoride red phosphors first synthesized by the present invention have a tetragonal crystal structure, emit light by an ultraviolet or blue excitation source and exhibit maximum emission brightness within a red wavelength range of 610 to 670 nm. Accordingly, the metal fluoride red phosphor according to the present invention is useful for manufacturing white light emitting elements.

In addition, the metal fluoride red phosphor according to the present invention can be easily manufactured by solid state reaction that includes physically mixing an ordinary phosphor or a phosphor matrix as a raw material.

In addition, the metal fluoride red phosphor according to the present invention can be easily manufactured by liquid state reaction that includes dissolving a raw material in an acid such as HF.

DESCRIPTION OF DRAWINGS

The above and other objectives, features and other advantages of the present invention will be more clearly understood from the following detailed description taken in conjunction with the accompanying drawings, in which:

FIG. 3A shows XRD analysis results of the $K_3SiF_7:Mn^{4+}$ phosphor and FIG. 3B shows Rietveld refinement results of the $K_3SiF_7:Mn^{4+}$ phosphor;

FIG. 13A shows measurement results of decay times of the $K_3SiF_7$:$Mn^{4+}$ phosphors manufactured in Examples 1, 2, 5 and 8, and FIG. 13B shows comparison results of decay times between the $K_3SiF_7$:$Mn^{4+}$ phosphor and the $K_2SiF_6$:$Mn^{4+}$ phosphor used as a raw material;

FIG. 14A is an image of a crystal powder of the $K_3SiF_7$:$Mn^{4+}$ phosphor and FIG. 14B is a scanning electron micrograph of the crystal powder of the $K_3SiF_7$:$Mn^{4+}$ phosphor;

FIG. 15A is an image of a crystal powder of the $K_3TiF_7$:$Mn^{4+}$ phosphor and FIG. 15B is a scanning electron micrograph of the crystal powder of the $K_3TiF_7$:$Mn^{4+}$ phosphor;

FIG. 16A is an image of a crystal powder of the $(NH_4)_3SiF_7$:$Mn_x^{4+}$ phosphor and FIG. 16B is a scanning electron micrograph of the crystal powder of the $(NH_4)_3SiF_7$:$Mn_x^{4+}$ phosphor;

FIG. 17A is an image of a crystal powder of the $(NH_4)_3GeF_7$:$Mn_x^{4+}$ phosphor and FIG. 17B is a scanning electron micrograph of the crystal powder of the $(NH_4)_3GeF_7$:$Mn_x^{4+}$ phosphor;

FIG. 18A is an image of a crystal powder of the $Rb_2KSiF_7$:$Mn_x^{4+}$ phosphor and FIG. 18B is a scanning electron micrograph of the crystal powder of the $Rb_2KSiF_7$:$Mn_x^{4+}$ phosphor.

BEST MODE

Figure 1:
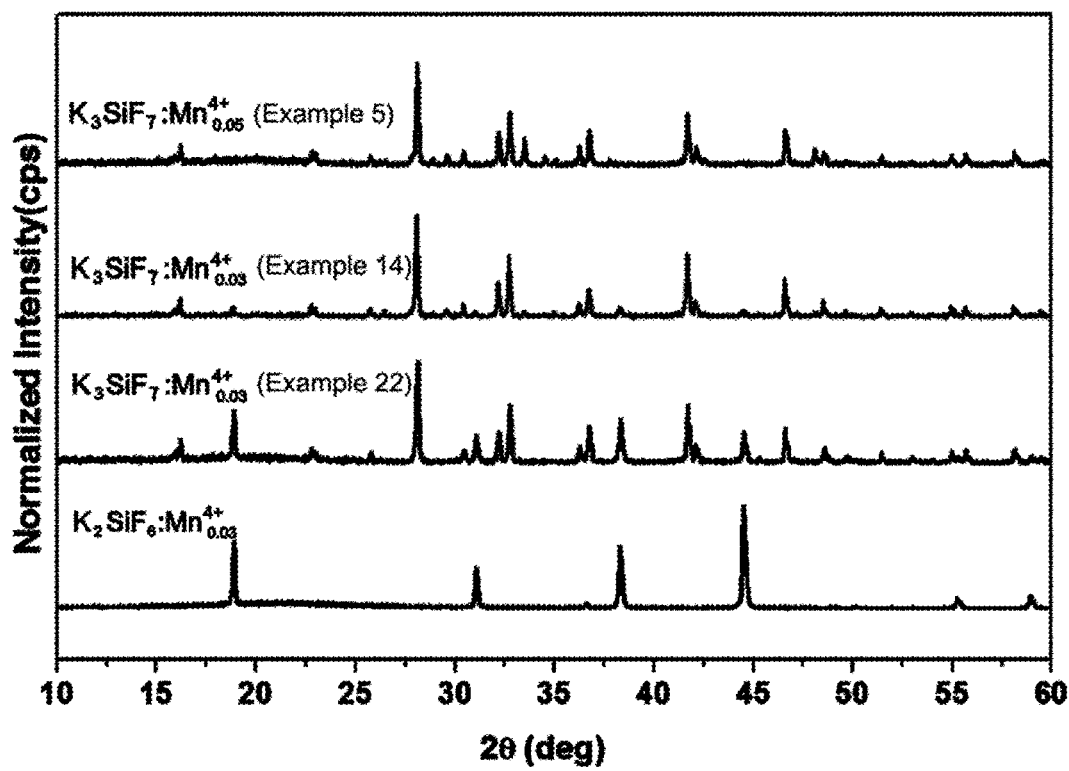
FIG. 1 shows XRD analysis results to compare the crystal structure between a $K_3SiF_7:Mn^{4+}$ phosphor and a $K_2SiF_6:Mn^{4+}$ phosphor used as a raw material.

The present invention relates to a novel metal fluoride red phosphor having a composition represented by Formula 1 below:

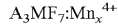

$$A_3MF_7\text{:}Mn_x^{4+} \quad \text{[Formula 1]}$$

wherein A is selected from K, Rb, $NH_4$ and a combination thereof, M is a metal element selected from Si, Ge, Ti and a combination thereof, and x satisfies $0 < x \leq 0.15$.

The metal fluoride red phosphor having a composition represented by Formula 1 has a tetragonal crystal structure. Although the $K_3ZrF_7$:$Mn_x^{4+}$ phosphor has a composition of $A_3MF_7$:$Mn^{4+}$, its crystal structure is a cubic structure. On the other hand, the phosphor according to the present invention is a phosphor that is substituted by a silicon (Si), germanium (Ge), or titanium (Ti) metal element, instead of zirconium (Zr), which its crystal structure is a tetragonal structure that is quite different from the $K_3ZrF_7$:$Mn_x^{4+}$ phosphor.

In addition, the metal fluoride red phosphor having a composition represented by Formula 1 is preferably a phosphor wherein A is potassium (K), or a phosphor wherein M is silicon (Si) or titanium (Ti).

In addition, the metal fluoride red phosphor having a composition represented by Formula 1 is characterized by emitting red light by an ultraviolet or blue excitation source.

Specifically, the metal fluoride red phosphor having a composition represented by Formula 1 has an excitation wavelength region of 365 to 480 nm and a central emission wavelength region of 610 to 670 nm.

The metal fluoride red phosphor according to the present invention having light emission properties described above can be applied to white light emitting elements. Accordingly, the present invention is characterized by a white light emitting element including the metal fluoride red phosphor having a composition represented by Formula 1.

When the white light emitting element is manufactured using the metal fluoride red phosphor according to the present invention, an ordinary phosphor may be further incorporated. The ordinary phosphor is a YAG:Ce phosphor and a $L_2SiO_4$:Eu phosphor (wherein L is an alkaline earth metal selected from Mg, Ca, Sr and Ba). Furthermore, a red phosphor ordinarily used for manufacturing white light emitting elements may be suitably incorporated, and the selection and content of the ordinary phosphor may be changed depending on application.

In addition, the light emitting element according to the present invention may include a light emitting diode, a laser diode, a surface-emitting laser diode, an inorganic electroluminescent element, an organic electroluminescent element or the like. Furthermore, the light emitting element is applicable to all lighting devices emitting light.

Meanwhile, the present invention is also characterized by a method for manufacturing the metal fluoride red phosphor having a composition represented by Formula 1. The method for manufacturing the metal fluoride red phosphor according to the present invention can be carried out by solid state reaction or liquid state reaction.

A method for manufacturing a metal fluoride red phosphor by solid state reaction, which is the first manufacturing method according to the present invention, includes:

(step 1) weighing a raw material containing an A precursor, an M precursor and a manganese (Mn) precursor, and physically mixing the material;

(step 2) drying the raw material mixture in an oven at 80 to 150° C.; and (step 3) heat-treating the dried mixture at 100 to 500° C. under a hydrogen gas, a nitrogen gas or a gas mixture thereof to prepare the metal fluoride red phosphor having a composition ratio represented by Formula 1.

The method of manufacturing the phosphor by solid state reaction may use, as a raw material, a phosphor matrix of metal fluoride or a metal fluoride phosphor containing a manganese (Mn) lubricant, disclosed in Patent Document 3, and involve physically mixing the raw material and heat-treating the material under a hydrogen gas, a nitrogen gas or a gas mixture thereof to obtain the phosphor.

Specifically, examples of the raw material used for the method for manufacturing a metal fluoride red phosphor by solid state reaction are as follows. The A precursor may include one or more selected from AF, $AHF_2$, $A_2O$, $A_2CO_3$, $CH_3COO$-A, $A_2MnF_6$, $A_2MF_6$ and $A_2MF_6$:$Mn^{4+}$. The M precursor may include one or more selected from $A_2MF_6$ and $A_2MF_6$:$Mn^{4+}$. In addition, the manganese (Mn) precursor may include one or more selected from $A_2MnF_6$ and $A_2MF_6$:$Mn^{4+}$. In this case, A and M are as defined in Formula 1.

$A_2MF_6$ or $A_2MF_6$:$Mn^{4+}$ used as the A precursor, the M precursor or the manganese (Mn) precursor for solid state reaction according to the present invention is a phosphor disclosed in Patent Document 3. $A_2MF_6$ or $A_2MF_6$:$Mn^{4+}$ used for solid state reaction of the present invention may specifically include $K_2SiF_6$, $K_2GeF_6$, $K_2TiF_6$, $K_2MnF_6$, $K_2SiF_6$:+, $K_2GeF_6$:$Mn^{4+}$, $K_2TiF_6$:$Mn^{4+}$, $Rb_2SiF_6$, $Rb_2GeF_6$, $Rb_2TiF_6$, $Rb_2MnF_6$, $Rb_2SiF_6$:$Mn^{4+}$, $Rb_2GeF_6$:$Mn^{4+}$, $Rb_2TiF_6$:$Mn^{4+}$, $(NH_4)_2SiF_6$, $(NH_4)_2GeF_6$, $(NH_4)_2TiF_6$, $(NH_4)_2MnF_6$, $(NH_4)_2SiF_6$:$Mn^{4+}$, $(NH_4)_2GeF_6$:$Mn^{4+}$, $(NH_4)_2TiF_6$:$Mn^{4+}$ and the like.

In solid state reaction of the present invention, the raw material is physically mixed and the mixing is carried out by a method ordinarily used in the art, for example, mortar and pestle, wet ball mill, dry ball mill or the like. The present invention has no particular limitation as to the method for physically mixing the raw material. In addition, physical mixing of the raw material can be carried out by mixing the material in the form of a powder through application of physical force without using an additional solvent, or mixing the material in the form of a slurry through application of physical force using a small amount of solvent. The solvent used for mixing the raw material may be also selected from those ordinarily used in the art and may specifically include one or more selected from acetone and C1-C4 alcohols.

The solid state reaction of the present invention may include, before heat-treating the raw material mixture, drying the raw material mixture in order to remove moisture and the solvent contained in the mixture. The drying temperature is preferably 80 to 150° C., because, when the drying temperature is excessively low, drying time may be lengthened and when the drying temperature is excessively high, moisture or the solvent reacts with the raw material, thus producing undesired by-products.

In accordance with the solid state reaction of the present invention, the raw material mixture is heat-treated under a reducing atmosphere at 200 to 1,000° C. to stably maintain an oxidation number of manganese and thereby produce the phosphor.

The reducing atmosphere can be maintained by creating an atmosphere of hydrogen gas, nitrogen gas or a mixture thereof. Specifically, the reducing atmosphere preferably consists of 0 to 40 vol % of hydrogen gas ($H_2$) and 60 to 100 vol % of nitrogen gas ($N_2$). More preferably, the reducing atmosphere is a gas mixture consisting of 20 to 30 vol % of hydrogen gas ($H_2$) and 70 to 80 vol % of nitrogen gas ($N_2$). When the content of hydrogen gas is excessively low, it may be difficult to maintain the oxidation state of manganese. On the other hand, when the content of the hydrogen gas is excessively high, safety problems such as risk of explosion may occur. For these reasons, the hydrogen gas is preferably within the range defined above.

The heat treatment may be carried out using an alumina crucible, a platinum or tungsten crucible, a boron nitride crucible or the like. The heat treatment temperature is preferably 200 to 1,000° C. When the heat treatment temperature is excessively low, phosphor crystals are not generated well, decreasing luminous efficacy, and when the heat treatment temperature is excessively high, variation in phosphor crystal structure occurs, thus deteriorating brightness.

The phosphor manufactured by solid state reaction described above can be ground using a ball mill or Z mill. If needed, the heat treatment and grinding may be repeated two or more times.

In addition, in order to control the content of a halogen element in the manufactured phosphor, cleaning may be further conducted. Even though cleaning causes change in content of halogen elements, the content of halogen elements in the finally obtained phosphor should satisfy the composition ratio represented by Formula 1. Specifically, the cleaning of the manufactured phosphor may be carried out using one or more solvents selected from acetone and C1-C4 alcohols. The cleaned phosphor may result in desired results such as great improvement in luminous brightness.

A method for manufacturing a metal fluoride red phosphor by liquid state reaction, which is the second manufacturing method according to the present invention, includes:

(step i) weighing a raw material containing an A precursor, an M precursor and a manganese (Mn) precursor, and dissolving the material in an acid;

(step ii) distilling, under reduced pressure, the acidic solution in which the raw material is dissolved, to obtain a solid;

(step iii) drying the obtained solid in an oven at 80 to 150° C.; and (step iv) heat-treating the dried solid at 200 to 1,000° C. under a hydrogen gas, a nitrogen gas or a gas mixture thereof to manufacture the phosphor having a composition ratio represented by Formula 1.

The method of manufacturing the phosphor by liquid state reaction may involve dissolving the raw material in an acid to prepare a solution, distilling the solution under reduced pressure to remove the solvent, and heat-treating the residue under a hydrogen gas, a nitrogen gas or a gas mixture thereof to obtain the phosphor.

The raw material used for the method for manufacturing a metal fluoride red phosphor by liquid state reaction is preferably a material that is readily dissolved in an acid. Specifically, the A precursor may include one or more selected from AF, $AHF_2$, $A_2O$, $A_2CO_3$, $CH_3COO$-A, $A_2MF_6$ and $A_2MnF_6$. The M precursor may include one or more selected from an M metal-containing metal oxide, $H_2MF_6$ and $A_2MF_6$. In addition, the manganese (Mn) precursor may be $A_2MnF_6$. In this case, A and M are defined as in Formula 1.

$A_2MF_6$ or $A_2MF_6$:$Mn_4^+$ used as the A precursor, the precursor or the manganese (Mn) precursor for liquid state reaction according to the present invention is a phosphor disclosed in Patent Document 3. $A_2MF_6$ or $A_2MF_6$:$Mn_4^+$ used for liquid state reaction of the present invention may specifically include $K_2SiF_6$, $K_2GeF_6$, $K_2TiF_6$, $K_2MnF_6$, $K_2SiF_6$:$Mn^{4+}$, $K_2GeF_6$:$Mn^{4+}$, $K_2TiF_6$:$Mn^{4+}$, $Rb_2SiF_6$, $Rb_2GeF_6$, $Rb_2TiF_6$, $Rb_2MnF_6$, $Rb_2SiF_6$:$Mn^{4+}$, $Rb_2GeF_6$:$Mn^{4+}$, $Rb_2TiF_6$:$Mn^{4+}$, $(NH_4)_2SiF_6$, $(NH_4)_2GeF_6$, $(NH_4)_2TiF_6$, $(NH_4)_2MnF_6$, $(NH_4)_2SiF_6$:$Mn^{4+}$, $(NH_4)_2GeF_6$:$Mn^{4+}$, $(NH_4)_2TiF_6$:$Mn^{4+}$ and the like.

The liquid state reaction of the present invention uses an acid to dissolve the raw material. Any acid may be selected from organic and inorganic acids without any limitation so long as it can dissolve the raw material. Specifically, the acid may include one or more selected from hydrofluoric acid (HF), hydrochloric acid (HCl) and sulfuric acid ($H_2SO_4$).

In accordance with the liquid state reaction of the present invention, the solvent is removed from the acidic solution in which the raw material is dissolved, using a vacuum distillation device, to obtain the solid. The obtained solid is dried in an oven at 80 to 150° C. to completely remove the remaining moisture and solvent. The drying temperature is preferably 80 to 150° C. because, when the drying temperature is excessively low, drying time may be lengthened and, when the drying temperature is excessively high, moisture or the solvent reacts with the raw material, thus producing undesired by-products.

In accordance with the liquid state reaction of the present invention, the dried solid is heat-treated under a reducing atmosphere at 200 to 1,000° C. to stably maintain an oxidation number of manganese and thereby manufacture the phosphor.

The reducing atmosphere can be maintained by creating an atmosphere of a hydrogen gas, a nitrogen gas or a gas mixture thereof. Specifically, the reducing atmosphere preferably consists of 0 to 40 vol % of hydrogen gas ($H_2$) and to 100 vol % of nitrogen gas ($N_2$). More preferably, the reducing atmosphere is a gas mixture consisting of 20 to 30 vol % of hydrogen gas ($H_2$) and 70 to 80 vol % of nitrogen gas ($N_2$). When the content of hydrogen gas is excessively low, it may be difficult to maintain the oxidation state of manganese. On the other hand, when the content of hydrogen gas is excessively high, safety problems such as risk of explosion may occur. For these reasons, the content of hydrogen gas is preferably within the range defined above.

The heat treatment may be carried out using an alumina crucible, a platinum or tungsten crucible, a boron nitride crucible or the like. The heat treatment temperature is preferably 200 to 1,000° C. When the heat treatment temperature is excessively low, phosphor crystals are not generated well, decreasing luminous efficacy, and when the heat treatment temperature is excessively high, variation in phosphor crystal structure occurs, thus deteriorating brightness.

The phosphor manufactured by liquid state reaction described above can be ground using a ball mill or Z mill. If needed, the heat treatment and grinding may be repeated two or more times.

In addition, in order to control the content of a halogen element in the manufactured phosphor, cleaning may be further conducted. Even though cleaning causes change in content of halogen element, the content of halogen element in the finally obtained phosphor should satisfy the composition ratio represented by Formula 1. Specifically, the cleaning of the manufactured phosphor may be carried out using one or more solvents selected from acetone and C1-C4 alcohols. The cleaned phosphor may result in desired results such as great improvement in luminous brightness.

The present invention has been described before and will be described in more detail with reference to the following Example and Test Example, but the present invention is not limited thereto.

EXAMPLE

Examples 1 to 50. Manufacture of Phosphor by Solid State Reaction

Raw materials each containing an A precursor, an M precursor and a manganese (Mn) precursor under content conditions shown in the following Table 1 or 2 were each weighed and placed in a mortar and pestle, 5 mL of ethanol was added thereto and physical mixing was conducted for 10 minutes. The raw material mixture was dried in an oven at a constant temperature of 100° C. for 1 hour to completely remove the ethanol. The dried raw material mixture was subjected to heat treatment in a platinum and boron nitride crucible under a reducing atmosphere at 400° C. for 30 minutes. At this time, the reducing atmosphere was created and maintained by supplying a gas mixture of hydrogen (150 mL/min) and nitrogen (450 mL/min). The phosphor obtained by heat treatment was ground to a particle size of 20 μm or less to obtain a phosphor powder.

TABLE 1

| Item | Composition formula of phosphor | Raw material |
|---|---|---|
| Example 1 | $K_3SiF_7:Mn^{4+}_{0.005}$ | $K_2SiF_6$ (1 g)<br>$K_2MnF_6$ (0.005 g) |
| Example 2 | $K_3SiF_7:Mn^{4+}_{0.01}$ | $K_2SiF_6$ (1 g)<br>$K_2MnF_6$ (0.01 g) |
| Example 3 | $K_3SiF_7:Mn^{4+}_{0.015}$ | $K_2SiF_6$ (1 g)<br>$K_2MnF_6$ (0.015 g) |
| Example 4 | $K_3SiF_7:Mn^{4+}_{0.02}$ | $K_2SiF_6$ (1 g)<br>$K_2MnF_6$ (0.02 g) |
| Example 5 | $K_3SiF_7:Mn^{4+}_{0.03}$ | $K_2SiF_6$ (1 g)<br>$K_2MnF_6$ (0.03 g) |
| Example 6 | $K_3SiF_7:Mn^{4+}_{0.05}$ | $K_2SiF_6$ (1 g)<br>$K_2MnF_6$ (0.05 g) |
| Example 7 | $K_3SiF_7:Mn^{4+}_{0.17}$ | $K_2SiF_6$ (1 g)<br>$K_2MnF_6$ (0.07 g) |
| Example 8 | $K_3SiF_7:Mn^{4+}_{0.1}$ | $K_2SiF_6$ (1 g)<br>$K_2MnF_6$ (0.1 g) |
| Example 9 | $K_3SiF_7:Mn^{4+}_{0.15}$ | $K_2SiF_6$ (1 g)<br>$K_2MnF_6$ (0.15 g) |
| Example 10 | $K_3SiF_7:Mn^{4+}_{0.2}$ | $K_2SiF_6$ (1 g)<br>$K_2MnF_6$ (0.2 g) |
| Example 11 | $K_3SiF_7:Mn^{4+}_{0.03}$ | $K_2SiF_6$ (1 g)<br>$KHF_2$ (0.2 g)<br>$K_2MnF_6$ (0.03 g) |
| Example 12 | $K_3SiF_7:Mn^{4+}_{0.03}$ | $K_2SiF_6$ (1 g)<br>$KHF_2$ (0.3 g)<br>$K_2MnF_6$ (0.03 g) |
| Example 13 | $K_3SiF_7:Mn^{4+}_{0.03}$ | $K_2SiF_6$ (1 g)<br>$KHF_2$ (0.4 g)<br>$K_2MnF_6$ (0.03 g) |
| Example 14 | $K_3SiF_7:Mn^{4+}_{0.03}$ | $K_2SiF_6$ (1 g)<br>$KHF_2$ (0.5 g)<br>$K_2MnF_6$ (0.03 g) |
| Example 15 | $K_3SiF_7:Mn^{4+}_{0.03}$ | $K_2SiF_6$ (1 g)<br>$KHF_2$ (0.6 g)<br>$K_2MnF_6$ (0.03 g) |
| Example 16 | $K_3SiF_7:Mn^{4+}_{0.03}$ | $K_2SiF_6$ (1 g)<br>$KHF_2$ (0.7 g)<br>$K_2MnF_6$ (0.03 g) |
| Example 17 | $K_3SiF_7:Mn^{4+}_{0.03}$ | $K_2SiF_6$ (1 g)<br>$KHF_2$ (1.0 g)<br>$K_2MnF_6$ (0.03 g) |
| Example 18 | $K_3SiF_7:Mn^{4+}_{0.03}$ | $K_2SiF_6:Mn^{4+}_{0.03}$ (1 g) |
| Example 19 | $K_3SiF_7:Mn^{4+}_{0.03}$ | $K_2SiF_6:Mn^{4+}_{0.03}$ (1 g)<br>$KHF_2$ (0.2 g) |
| Example 20 | $K_3SiF_7:Mn^{4+}_{0.03}$ | $K_2SiF_6:Mn^{4+}_{0.03}$ (1 g)<br>$KHF_2$ (0.3 g) |
| Example 21 | $K_3SiF_7:Mn^{4+}_{0.03}$ | $K_2SiF_6:Mn^{4+}_{0.03}$ (1 g)<br>$KHF_2$ (0.4 g) |
| Example 22 | $K_3SiF_7:Mn^{4+}_{0.03}$ | $K_2SiF_6:Mn^{4+}_{0.03}$ (1 g)<br>$KHF_2$ (0.5 g) |
| Example 23 | $K_3SiF_7:Mn^{4+}_{0.03}$ | $K_2SiF_6:Mn^{4+}_{0.03}$ (1 g)<br>$KF$ (0.3 g)<br>$NH_4F$ (0.5 g) |
| Example 24 | $K_3SiF_7:Mn^{4+}_{0.03}$ | $K_2SiF_6:Mn^{4+}_{0.03}$ (1 g)<br>$K_2CO_3$ (0.2 g)<br>$NH_4F$ (0.5 g) |
| Example 25 | $K_3SiF_7:Mn^{4+}_{0.03}$ | $K_2SiF_6:Mn^{4+}_{0.03}$ (1 g)<br>$CH_3COOK$ (0.3 g)<br>$NH_4F$ (0.5 g) |
| Example 26 | $K_3SiF_7:Mn^{4+}_{0.03}$ | $K_2SiF_6:Mn^{4+}_{0.03}$ (1 g)<br>$K_2O$ (0.2 g)<br>$NH_4F$ (0.5 g) |
| Example 27 | $K_3TiF_7:Mn^{4+}_{0.01}$ | $K_2TiF_6$ (1 g)<br>$K_2MnF_6$ (0.01 g) |
| Example 28 | $K_3TiF_7:Mn^{4+}_{0.015}$ | $K_2TiF_6$ (1 g)<br>$K_2MnF_6$ (0.015 g) |
| Example 29 | $K_3TiF_7:Mn^{4+}_{0.02}$ | $K_2TiF_6$ (1 g)<br>$K_2MnF_6$ (0.02 g) |
| Example 30 | $K_3TiF_7:Mn^{4+}_{0.03}$ | $K_2TiF_6$ (1 g)<br>$K_2MnF_6$ (0.03 g) |
| Example 31 | $K_3TiF_7:Mn^{4+}_{0.05}$ | $K_2TiF_6$ (1 g)<br>$K_2MnF_6$ (0.05 g) |
| Example 32 | $K_3TiF_7:Mn^{4+}_{0.07}$ | $K_2TiF_6$ (1 g)<br>$K_2MnF_6$ (0.07 g) |
| Example 33 | $K_3TiF_7:Mn^{4+}_{0.1}$ | $K_2TiF_6$ (1 g)<br>$K_2MnF_6$ (0.1 g) |

TABLE 1-continued

| Item | Composition formula of phosphor | Raw material |
|---|---|---|
| Example 34 | $K_3TiF_7:Mn^{4+}_{0.15}$ | $K_2TiF_6$ (1 g) $K_2MnF_6$ (0.15 g) |
| Example 35 | $K_3TiF_7:Mn^{4+}_{0.2}$ | $K_2TiF_6$ (1 g) $K_2MnF_6$ (0.2 g) |
| Example 36 | $K_3TiF_7:Mn^{4+}_{0.03}$ | $K_2TiF_6$ (1 g) $KHF_2$ (0.2 g) $K_2MnF_6$ (0.03 g) |
| Example 37 | $K_3TiF_7:Mn^{4+}_{0.03}$ | $K_2TiF_6$ (1 g) $KHF_2$ (0.3 g) $K_2MnF_6$ (0.03 g) |
| Example 38 | $K_3TiF_7:Mn^{4+}_{0.03}$ | $K_2TiF_6$ (1 g) $KHF_2$ (0.4 g) $K_2MnF_6$ (0.03 g) |
| Example 39 | $K_3TiF_7:Mn^{4+}_{0.03}$ | $K_2TiF_6$ (1 g) $KF$ (0.3 g) $NH_4F$ (0.5 g) $K_2MnF_6$ (0.03 g) |

TABLE 2

| Item | Composition formula of phosphor | Raw material |
|---|---|---|
| Example 40 | $K_3TiF_7:Mn^{4+}_{0.03}$ | $K_2TiF_6$ (1 g) $K_2CO_3$ (0.2 g) $NH_4F$ (0.5 g) $K_2MnF_6$ (0.03 g) |
| Example 41 | $K_3TiF_7:Mn^{4+}_{0.03}$ | $K_2TiF_6$ (1 g) $CH_3COOK$ (0.3 g) $NH_4F$ (0.5 g) $K_2MnF_6$ (0.03 g) |
| Example 42 | $K_3TiF_7:Mn^{4+}_{0.03}$ | $K_2TiF_6$ (1 g) $K_2O$ (0.2 g) $NH_4F$ (0.5 g) $K_2MnF_6$ (0.03 g) |
| Example 43 | $K_3TiF_7:Mn^{4+}_{0.03}$ | $K_2TiF_6:Mn^{4+}_{0.03}$ (1 g) |
| Example 44 | $K_3TiF_7:Mn^{4+}_{0.03}$ | $K_2TiF_6:Mn^{4+}_{0.03}$ (1 g) $KHF_2$ (0.2 g) |
| Example 45 | $K_3TiF_7:Mn^{4+}_{0.03}$ | $K_2TiF_6:Mn^{4+}_{0.03}$ (1 g) $KHF_2$ (0.3 g) |
| Example 46 | $K_3TiF_7:Mn^{4+}_{0.03}$ | $K_2TiF_6:Mn^{4+}_{0.03}$ (1 g) $KHF_2$ (0.4 g) |
| Example 47 | $K_3TiF_7:Mn^{4+}_{0.03}$ | $K_2TiF_6:Mn^{4+}_{0.033}$ (1 g) $KF$ (0.3 g) $NH_4F$ (0.5 g) |
| Example 48 | $K_3TiF_7:Mn^{4+}_{0.03}$ | $K_2TiF_6:Mn^{4+}_{0.03}$ (1 g) $K_2CO_3$ (0.2 g) $NH_4F$ (0.5 g) |
| Example 49 | $K_3TiF_7:Mn^{4+}_{0.03}$ | $K_2TiF_6:Mn^{4+}_{0.03}$ (1 g) $CH_3COOK$ (0.3 g) $NH_4F$ (0.5 g) |
| Example 50 | $K_3TiF_7:Mn^{4+}_{0.03}$ | $K_2TiF_6:Mn^{4+}_{0.03}$ (1 g) $K_2O$ (0.2 g) $NH_4F$ (0.5 g) |

Examples 51 to 62. Manufacture of Phosphor by Liquid State Reaction

Raw materials each containing an A precursor, an M precursor and a manganese (Mn) precursor under content conditions shown in the following Table 3 or 4 were each weighed and dissolved in 100 mL of hydrofluoric acid (HF) while stirring. The raw material-containing solution was thoroughly stirred to complete dissolution and then distilled under reduced pressure to obtain a solid. The resulting solid was dried in an oven at a constant temperature of 100° C. for 1 hour to completely remove the remaining hydrofluoric acid. The dried solid was subjected to heat treatment in a platinum and boron nitride crucible under a reducing atmosphere at 400° C. for 30 minutes. At this time, the reducing atmosphere was created and maintained by supplying a gas mixture of hydrogen (150 mL/min) and nitrogen (450 mL/min). The phosphor obtained by heat treatment was ground to a particle size of 20 μm or less to obtain a phosphor powder.

TABLE 3

| Item | Composition formula of phosphor | Raw material |
|---|---|---|
| Example 51 | $K_3SiF_7:Mn^{4+}_{1.1}$ | $H_2SiF_6$ (0.5 g) $K_2MnF_6$ (1 g) |
| Example 52 | $K_3SiF_7:Mn^{4+}_{0.34}$ | $H_2SiF_6$ (0.5 g) $KHF_2$ (1 g) $K_2MnF_6$ (0.03 g) |
| Example 53 | $K_3SiF_7:Mn^{4+}_{0.34}$ | $H_2SiF_6$ (0.5 g) $KF$ (1 g) $NH_4F$ (0.5 g) $K_2MnF_6$ (0.03 g) |
| Example 54 | $K_3SiF_7:Mn^{4+}_{0.34}$ | $H_2SiF_6$ (0.5 g) $K_2CO_3$ (1 g) $NH_4F$ (0.5 g) $K_2MnF_6$ (0.03 g) |
| Example 55 | $K_3SiF_7:Mn^{4+}_{0.34}$ | $H_2SiF_6$ (0.5 g) $CH_3COOK$ (1 g) $NH_4F$ (0.5 g) $K_2MnF_6$ (0.03 g) |
| Example 56 | $K_3SiF_7:Mn^{4+}_{0.34}$ | $H_2SiF_6$ (0.5 g) $K_2O$ (1 g) $NH_4F$ (0.5 g) $K_2MnF_6$ (0.03 g) |

TABLE 4

| Item | Composition formula of phosphor | Raw material |
|---|---|---|
| Example 57 | $K_3TiF_7:Mn^{4+}_{1.1}$ | $H_2TiF_6$ (0.5 g) $K_2MnF_6$ (1 g) |
| Example 58 | $K_3TiF_7:Mn^{4+}_{0.34}$ | $H_2TiF_6$ (0.5 g) $KHF_2$ (1 g) $K_2MnF_6$ (0.03 g) |
| Example 59 | $K_3TiF_7:Mn^{4+}_{0.34}$ | $H_2TiF_6$ (0.5 g) $KF$ (1 g) $NH_4F$ (0.5 g) $K_2MnF_6$ (0.03 g) |
| Example 60 | $K_3TiF_7:Mn^{4+}_{0.34}$ | $H_2TiF_6$ (0.5 g) $K_2CO_3$ (1 g) $NH_4F$ (0.5 g) $K_2MnF_6$ (0.03 g) |
| Example 61 | $K_3TiF_7:Mn^{4+}_{0.34}$ | $H_2TiF_6$ (0.5 g) $CH_3COOK$ (1 g) $NH_4F$ (0.5 g) $K_2MnF_6$ (0.03 g) |
| Example 62 | $K_3TiF_7:Mn^{4+}_{0.34}$ | $H_2TiF_6$ (0.5 g) $K_2O$ (1 g) $NH_4F$ (0.5 g) $K_2MnF_6$ (0.03 g) |

Examples 63 to 92. Manufacture of Phosphor by Solid State Reaction

Raw materials each containing an A precursor, an M precursor and a manganese (Mn) precursor under content conditions shown in the following Table 5, 6 or 7 were each weighed and placed in a mortar/pestle, 5 mL of acetone was added thereto and physical mixing was conducted for 10 minutes. The raw material mixture was dried in an oven at a constant temperature of 60° C. for 1 hour to completely remove the acetone. The dried raw material mixture was subjected to heat treatment in a platinum and boron nitride crucible under a reducing atmosphere using $(NH_4)HF_2$ precursor at 150° C. for 3 minutes and then $KHF_2$ precursor at 300° C. for 3 hours. At this time, the reducing atmosphere was created and maintained by supplying a gas mixture of hydrogen (150 mL/min) and nitrogen (450 mL/min). The phosphor obtained by heat treatment was ground to a particle size of 50 μm or less to obtain a phosphor powder.

TABLE 5

| Item | Composition formula of phosphor | Raw material |
|---|---|---|
| Example 63 | $(NH_4)_3SiF_7:Mn^{4+}_{0.05}$ | $(NH_4)_2SiF_6$ (1 g) $(NH_4)HF_2$ (0.2 g) $K_2MnF_6$ (0.05 g) |
| Example 64 | $(NH_4)_3SiF_7:Mn^{4+}_{0.05}$ | $(NH_4)_2SiF_6$ (1 g) $(NH_4)HF_2$ (0.4 g) $K_2MnF_6$ (0.05 g) |
| Example 65 | $(NH_4)_3SiF_7:Mn^{4+}_{0.05}$ | $(NH_4)_2SiF_6$ (1 g) $(NH_4)HF_2$ (0.6 g) $K_2MnF_6$ (0.05 g) |
| Example 66 | $(NH_4)_3SiF_7:Mn^{4+}_{0.005}$ | $(NH_4)_2SiF_6$ (1 g) $(NH_4)HF_2$ (0.8 g) $K_2MnF_6$ (0.005 g) |
| Example 67 | $(NH_4)_3SiF_7:Mn^{4+}_{0.01}$ | $(NH_4)_2SiF_6$ (1 g) $(NH_4)HF_2$ (0.5 g) $K_2MnF_6$ (0.01 g) |
| Example 68 | $(NH_4)_3SiF_7:Mn^{4+}_{0.02}$ | $(NH_4)_2SiF_6$ (1 g) $(NH_4)HF_2$ (0.5 g) $K_2MnF_6$ (0.02 g) |
| Example 69 | $(NH_4)_3SiF_7:Mn^{4+}_{0.04}$ | $(NH_4)_2SiF_6$ (1 g) $(NH_4)HF_2$ (0.5 g) $K_2MnF_6$ (0.04 g) |
| Example 70 | $(NH_4)_3SiF_7:Mn^{4+}_{0.06}$ | $(NH_4)_2SiF_6$ (1 g) $(NH_4)HF_2$ (0.5 g) $K_2MnF_6$ (0.06 g) |
| Example 71 | $(NH_4)_3SiF_7:Mn^{4+}_{0.08}$ | $(NH_4)_2SiF_6$ (1 g) $(NH_4)HF_2$ (0.5 g) $K_2MnF_6$ (0.08 g) |
| Example 72 | $(NH_4)_3SiF_7:Mn^{4+}_{0.1}$ | $(NH_4)_2SiF_6$ (1 g) $(NH_4)HF_2$ (0.5 g) $K_2MnF_6$ (0.1 g) |

TABLE 6

| Item | Composition formula of phosphor | Raw material |
|---|---|---|
| Example 73 | $(NH_4)_3GeF_7:Mn^{4+}_{0.05}$ | $(NH_4)_2GeF_6$ (1 g) $(NH_4)HF_2$ (0.2 g) $K_2MnF_6$ (0.05 g) |
| Example 74 | $(NH_4)_3GeF_7:Mn^{4+}_{0.05}$ | $(NH_4)_2GeF_6$ (1 g) $(NH_4)HF_2$ (0.4 g) $K_2MnF_6$ (0.05 g) |
| Example 75 | $(NH_4)_3GeF_7:Mn^{4+}_{0.05}$ | $(NH_4)_2GeF_6$ (1 g) $(NH_4)HF_2$ (0.6 g) $K_2MnF_6$ (0.05 g) |
| Example 76 | $(NH_4)_3GeF_7:Mn^{4+}_{0.005}$ | $(NH_4)_2GeF_6$ (1 g) $(NH_4)HF_2$ (0.8 g) $K_2MnF_6$ (0.005 g) |
| Example 77 | $(NH_4)_3GeF_7:Mn^{4+}_{0.01}$ | $(NH_4)_2GeF_6$ (1 g) $(NH_4)HF_2$ (0.5 g) $K_2MnF_6$ (0.01 g) |
| Example 78 | $(NH_4)_3GeF_7:Mn^{4+}_{0.02}$ | $(NH_4)_2GeF_6$ (1 g) $(NH_4)HF_2$ (0.5 g) $K_2MnF_6$ (0.02 g) |
| Example 79 | $(NH_4)_3GeF_7:Mn^{4+}_{0.04}$ | $(NH_4)_2GeF_6$ (1 g) $(NH_4)HF_2$ (0.5 g) $K_2MnF_6$ (0.04 g) |
| Example 80 | $(NH_4)_3GeF_7:Mn^{4+}_{0.06}$ | $(NH_4)_2GeF_6$ (1 g) $(NH_4)HF_2$ (0.5 g) $K_2MnF_6$ (0.06 g) |
| Example 81 | $(NH_4)_3GeF_7:Mn^{4+}_{0.08}$ | $(NH_4)_2GeF_6$ (1 g) $(NH_4)HF_2$ (0.5 g) $K_2MnF_6$ (0.08 g) |
| Example 82 | $(NH_4)_3GeF_7:Mn^{4+}_{0.1}$ | $(NH_4)_2GeF_6$ (1 g) $(NH_4)HF_2$ (0.5 g) $K_2MnF_6$ (0.1 g) |

TABLE 7

| Item | Composition formula of phosphor | Raw material |
|---|---|---|
| Example 83 | $Rb_2KSiF_7:Mn^{4+}_{0.05}$ | $(RbK_{0.5})_2SiF_6$ (1 g) $KHF_2$ (0.2 g) $K_2MnF_6$ (0.05 g) |
| Example 84 | $Rb_2KSiF_7:Mn^{4+}_{0.05}$ | $(RbK_{0.5})_2SiF_6$ (1 g) $(NH_4)HF_2$ (0.4 g) $K_2MnF_6$ (0.05 g) |
| Example 85 | $Rb_2KSiF_7:Mn^{4+}_{0.05}$ | $(RbK_{0.5})_2SiF_6$ (1 g) $KHF_2$ (0.6 g) $K_2MnF_6$ (0.05 g) |
| Example 86 | $Rb_2KSiF_7:Mn^{4+}_{0.005}$ | $(RbK_{0.5})_2SiF_6$ (1 g) $KHF_2$ (0.8 g) $K_2MnF_6$ (0.005 g) |
| Example 87 | $Rb_2KSiF_7:Mn^{4+}_{0.01}$ | $(RbK_{0.5})_2SiF_6$ (1 g) $KHF_2$ (0.5 g) $K_2MnF_6$ (0.01 g) |
| Example 88 | $Rb_2KSiF_7:Mn^{4+}_{0.02}$ | $(RbK_{0.5})_2SiF_6$ (1 g) $KHF_2$ (0.5 g) $K_2MnF_6$ (0.02 g) |
| Example 89 | $Rb_2KSiF_7:Mn^{4+}_{0.04}$ | $(RbK_{0.5})_2SiF_6$ (1 g) $KHF_2$ (0.5 g) $K_2MnF_6$ (0.04 g) |
| Example 90 | $Rb_2KSiF_7:Mn^{4+}_{0.06}$ | $(RbK_{0.5})_2SiF_6$ (1 g) $KHF_2$ (0.5 g) $K_2MnF_6$ (0.06 g) |
| Example 91 | $Rb_2KSiF_7:Mn^{4+}_{0.08}$ | $(RbK_{0.5})_2SiF_6$ (1 g) $KHF_2$ (0.5 g) $K_2MnF_6$ (0.08 g) |
| Example 92 | $Rb_2KSiF_7:Mn^{4+}_{0.1}$ | $(RbK_{0.5})_2SiF_6$ (1 g) $KHF_2$ (0.5 g) $K_2MnF_6$ (0.1 g) |

TEST EXAMPLE

Test Example 1: Analysis of Crystal Structure of Phosphor

The present Test Example 1 demonstrated that the metal fluoride phosphor represented by $A_3MF_7:Mn^{4+}$ according to the present invention was a crystal structure which was quite different from the metal fluoride phosphor represented by $A_2[MF_6]:Mn^{4+}$ used as a raw material in the present invention.

That is, as the metal fluoride phosphor according to the present invention, $K_3SiF_7:Mn^{4+}$ phosphors manufactured in Examples 5, 14 and 22, and the $K_3TiF_7:Mn^{4+}$ phosphor manufactured in Example 46 were selected. As Comparative Examples, the $K_2[SiF_6]:Mn^{4+}_{0.03}$ and $K_2[TiF_6]:Mn^{4+}_{0.03}$ phosphors used as raw materials in Examples 22 and 46 were selected.

Figure 2:
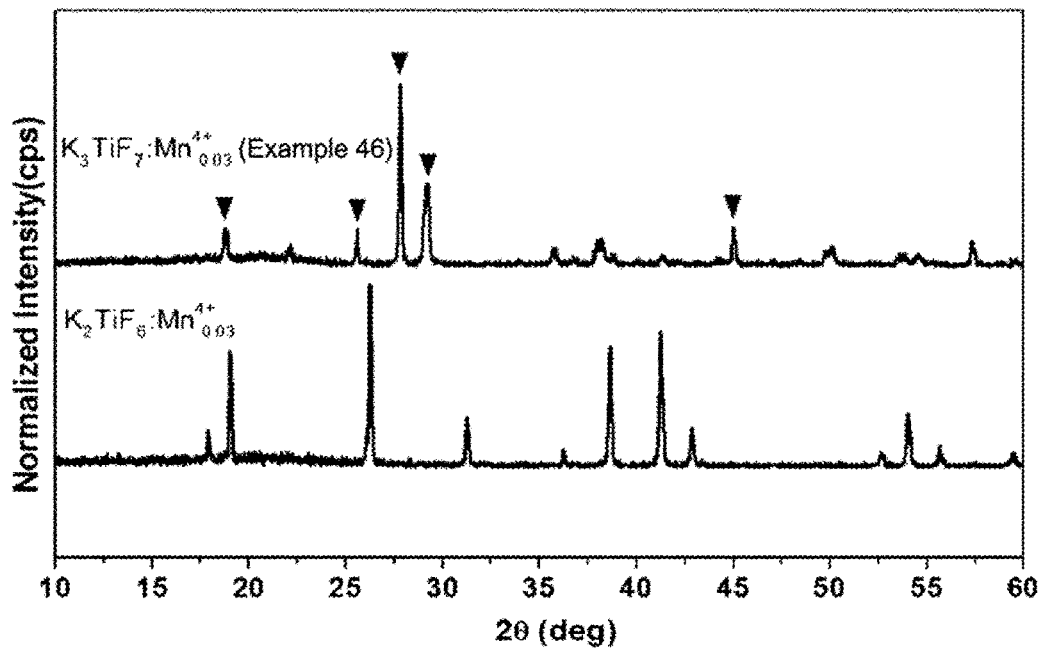
FIG. 2 shows XRD analysis results to compare the crystal structure between a $K_3TiF_7:Mn^{4+}$ phosphor and a $K_2TiF_6:Mn^{4+}$ phosphor used as a raw material.

FIGS. 1 and 2 show XRD analysis results of respective phosphors. FIG. 1 is an XRD spectrum to comparatively show the crystal structure between the $K_3SiF_7:Mn^{4+}$ phosphor and the $K_2SiF_6:Mn^{4+}_{0.03}$ phosphor used as a raw material. FIG. 2 is an XRD spectrum to comparatively show the crystal structure between the $K_3TiF7:Mn^{4+}$ phosphor and a $K_2TiF_6:Mn^{4+}_{0.03}$ phosphor used as a raw material. As can be seen from FIGS. 1 and 2, the metal fluoride phosphor represented by $A_3MF_7:Mn^{4+}$ according to the present invention was a phosphor having a crystal structure different from the $A_2MF_6:Mn^{4+}$ raw material.

Figure 3A:
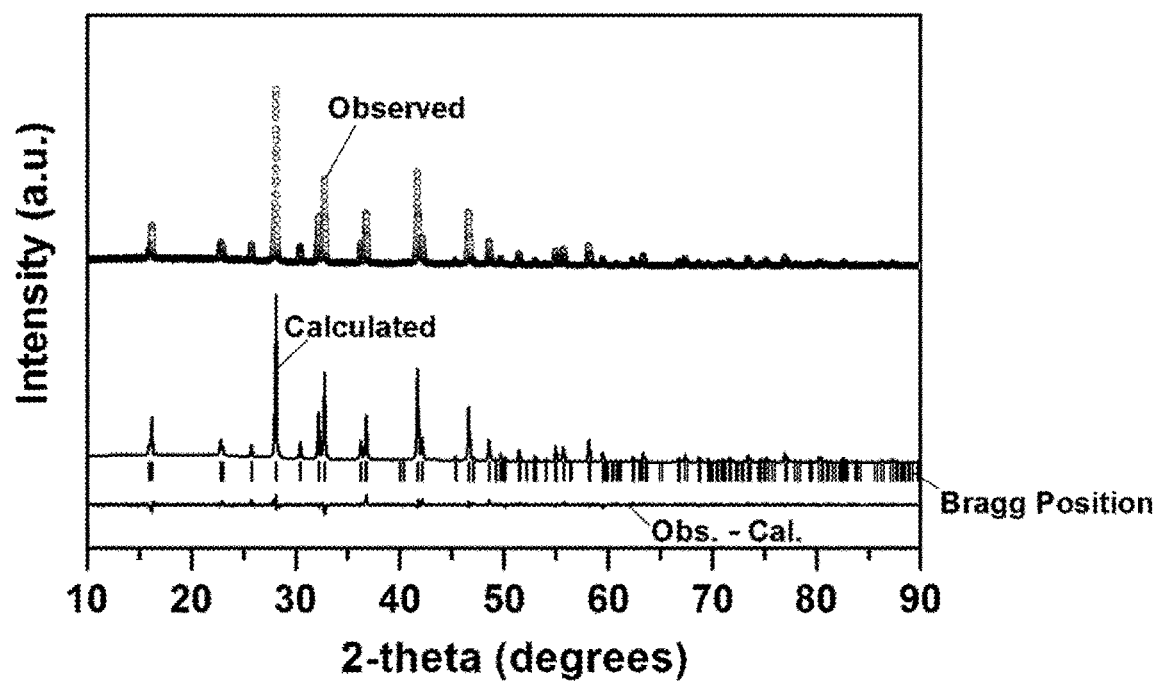
FIGS. 3A and 3B show crystal analysis results of the $K_3SiF_7:Mn^{4+}$ phosphor by Rietveld refinement, based on XRD analysis.
Figure 3B:
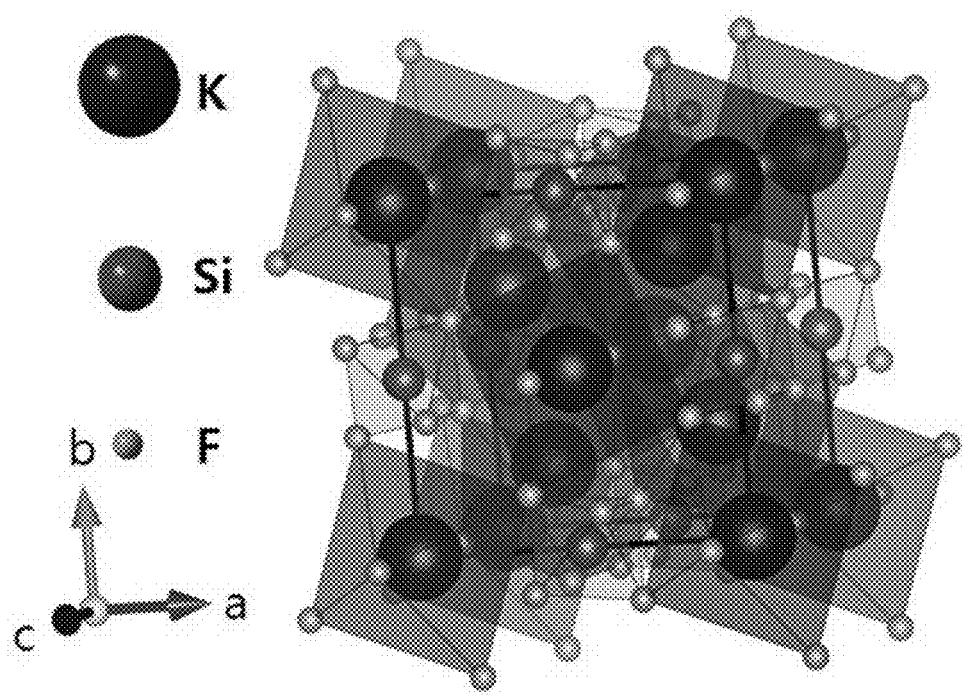
Figure 4:
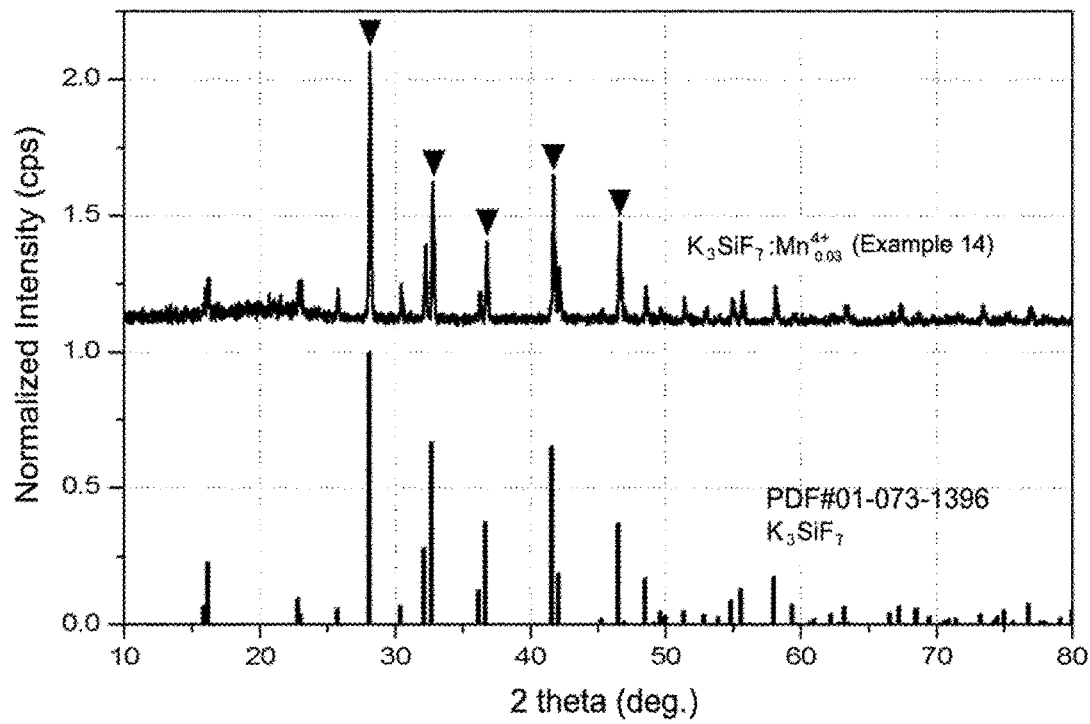
FIG. 4 shows XRD analysis results of the $K_3SiF_7:Mn^{4+}$ phosphor.
Figure 5:
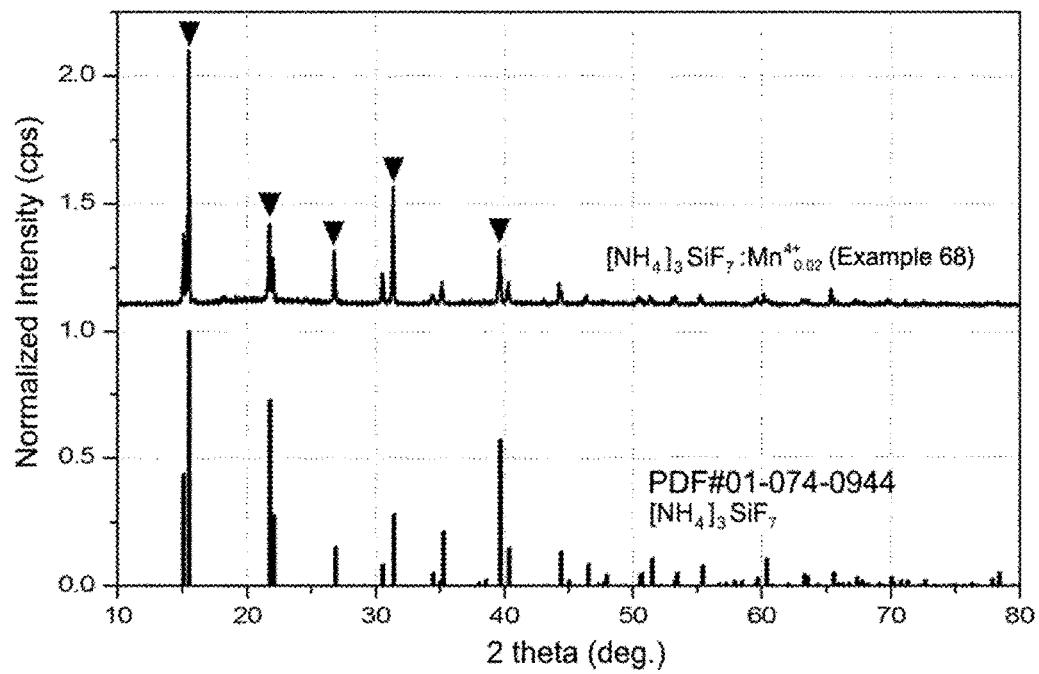
FIG. 5 shows XRD analysis results of a $(NH_4)_3SiF_7:Mn_x^{4+}$ phosphor.
Figure 6:
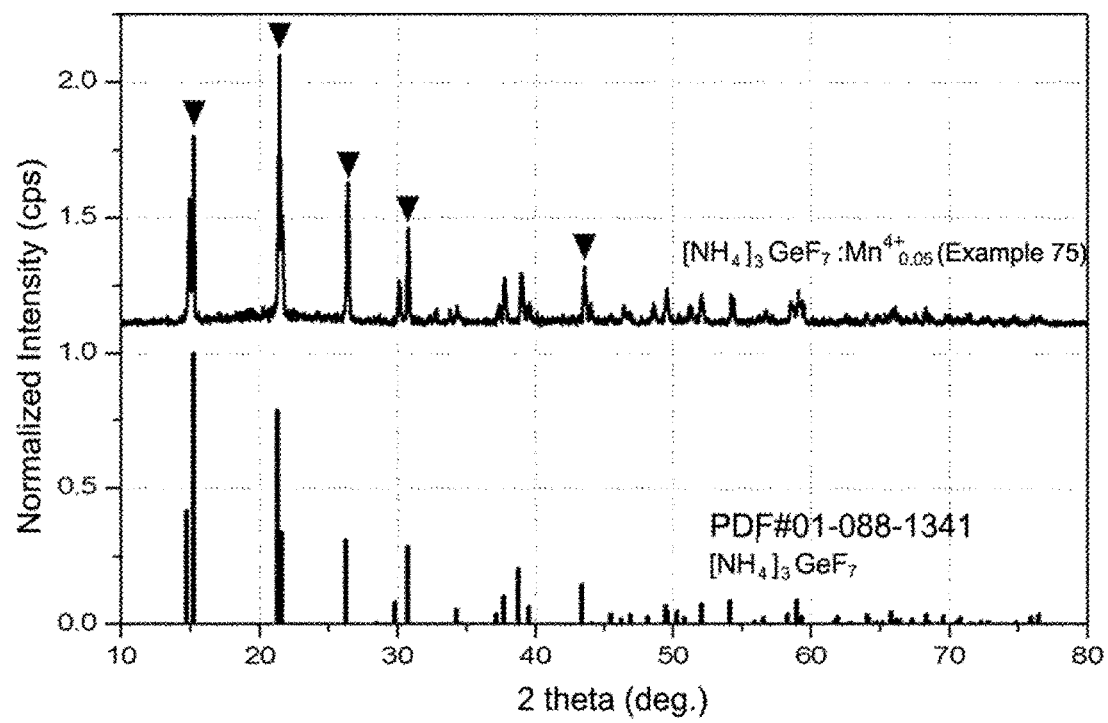
FIG. 6 shows XRD analysis results of a $(NH_4)_3GeF_7:Mn_x^{4+}$ phosphor.
Figure 7:
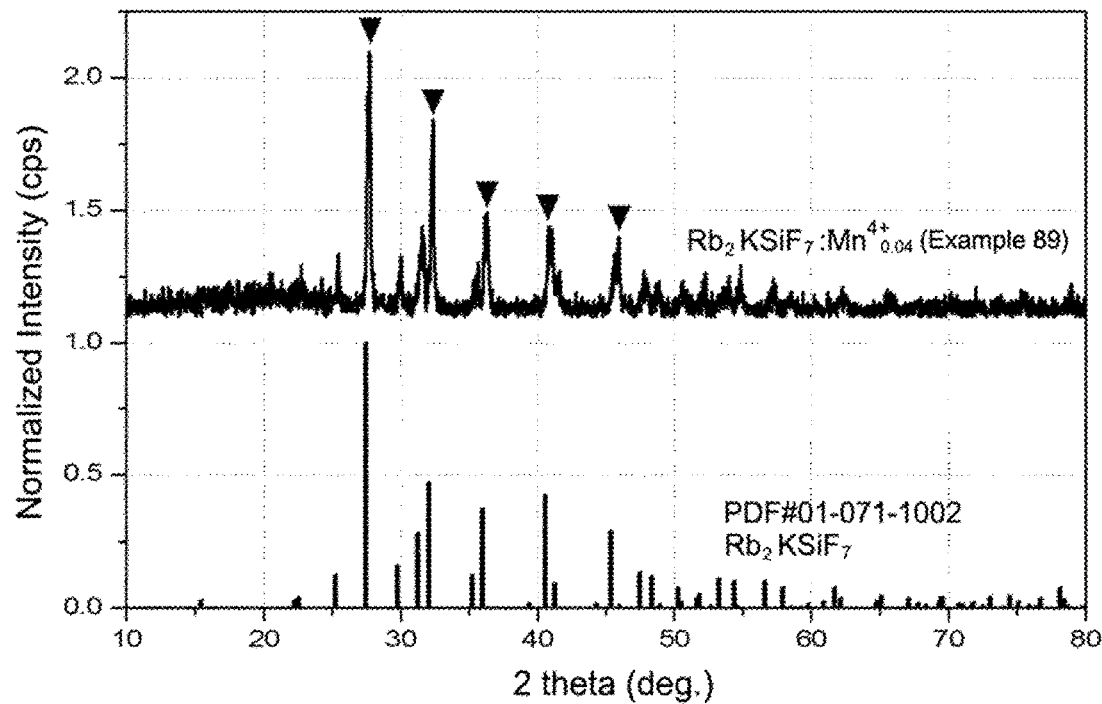
FIG. 7 shows XRD analysis results of a $Rb_2KSiF_7:Mn_x^{4+}$ phosphor.
Figure 8:
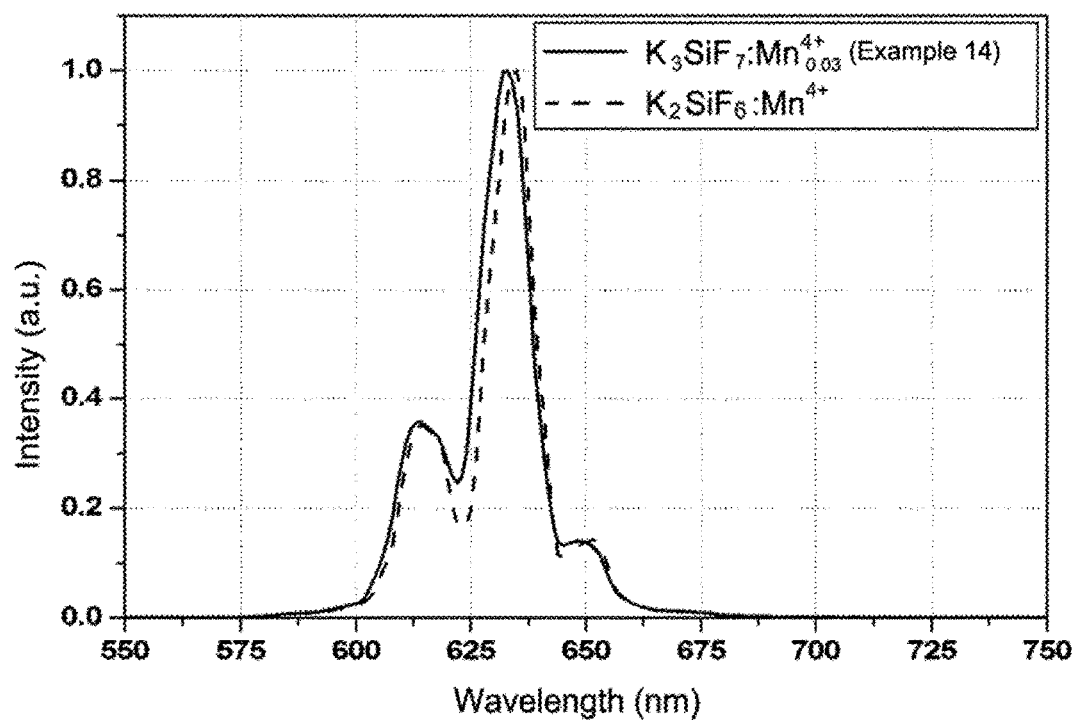
FIG. 8 shows results of comparison in emission spectrum (450 nm excitation light) between the $K_3SiF_7:Mn^{4+}$ phosphor and the $K_2SiF_6:Mn^{4+}$ phosphor used as a raw material.
Figure 9:
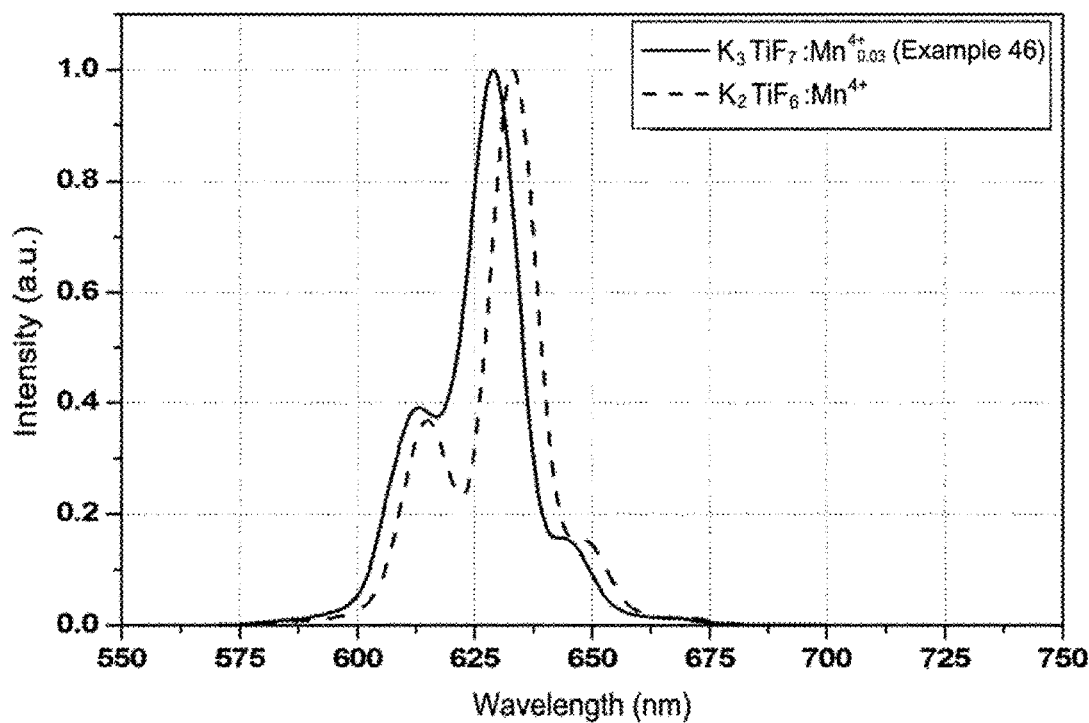
FIG. 9 shows results of comparison in emission spectrum (450 nm excitation light) between the $K_3TiF_7:Mn^{4+}$ phosphor and the $K_2TiF_6:Mn^{4+}$ phosphor used as a raw material.
Figure 10:
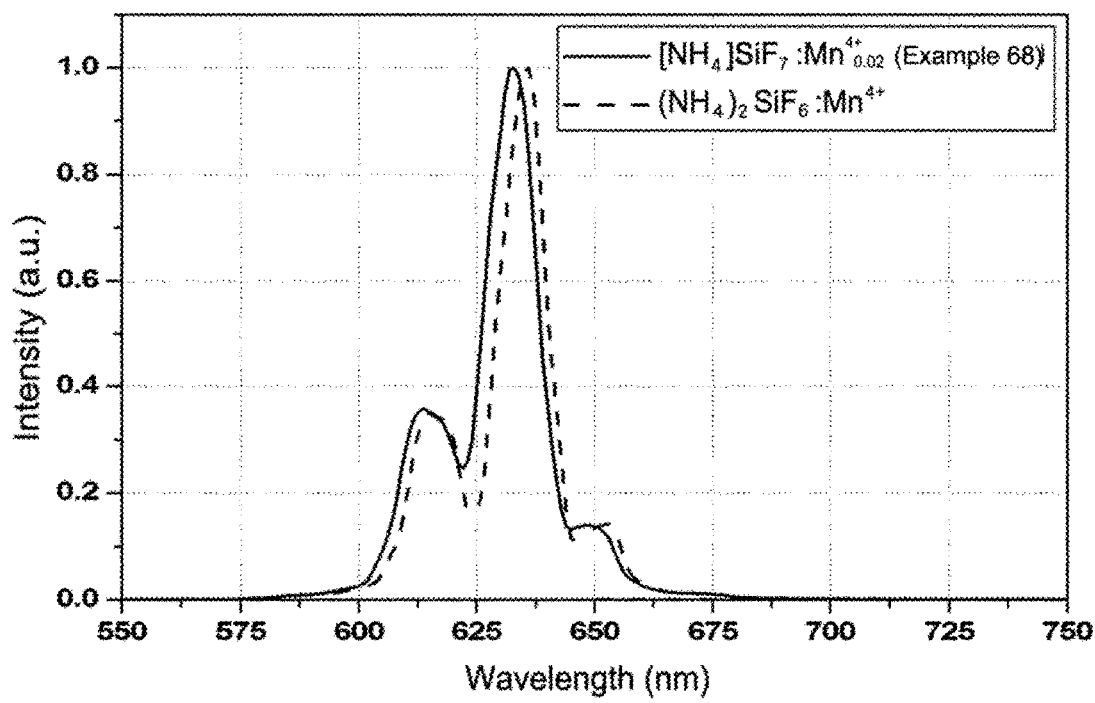
FIG. 10 shows results of comparison in emission spectrum (450 nm excitation light) between the $(NH_4)_3SiF_7:Mn_x^{4+}$ phosphor and the $(NH_4)_2SiF_6:Mn_x^{4+}$ phosphor used as a raw material.
Figure 11:
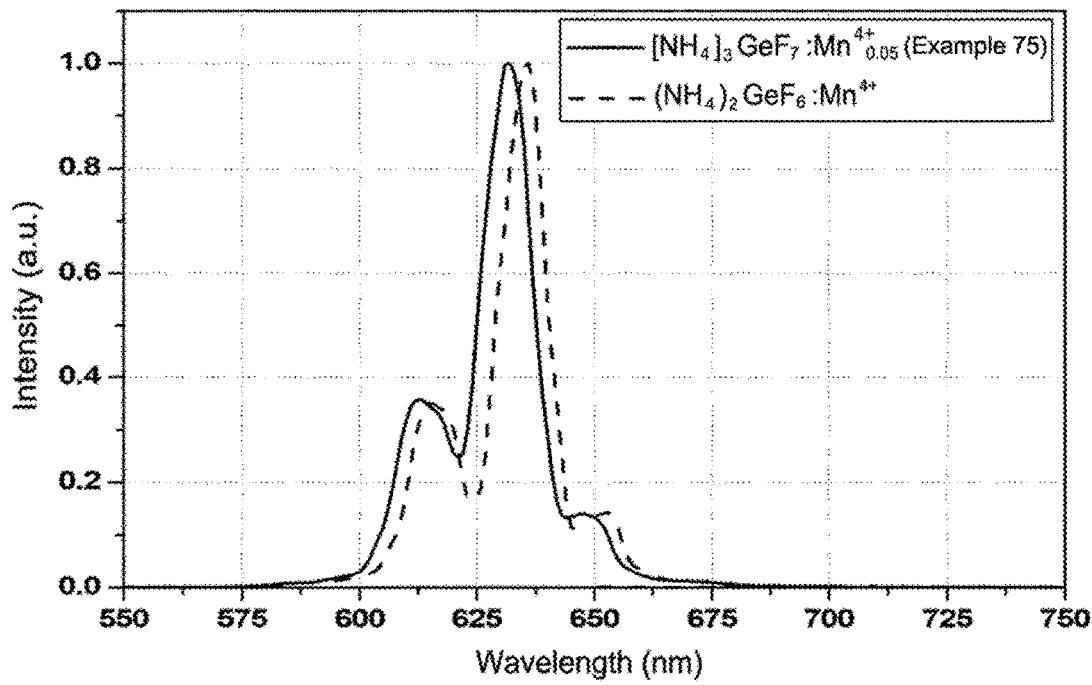
FIG. 11 shows results of comparison in emission spectrum (450 nm excitation light) between the $(NH_4)_3GeF_7$:$Mn_x^{4+}$ phosphor and the $(NH_4)_2GeF_6$:$Mn_x^{4+}$ phosphor used as a raw material.
Figure 12:
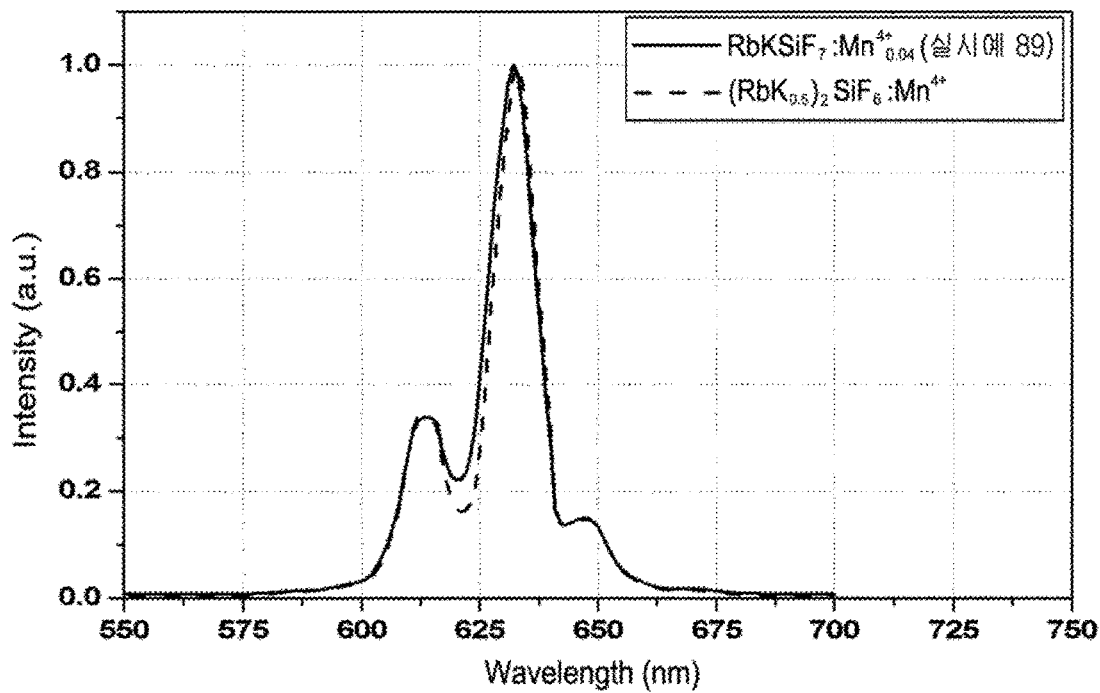
FIG. 12 shows results of comparison in emission spectrum (450 nm excitation light) between the $Rb_2KSiF_7$:$Mn_x^{4+}$ phosphor and the $(RbK_{0.5})_2SiF_6$:$Mn_x^{4+}$ phosphor used as a raw material.

FIGS. 3A and 3B show results of crystal structure analysis by Rietveld refinement to understand the crystal structure of the $K_3SiF_7:Mn^{4+}$ phosphor. FIG. 3A shows an XRD analysis result of the $K_3SiF_7:Mn^{4+}$ phosphor and FIG. 3B shows an Rietveld refinement result of the $K_3SiF_7:Mn^{4+}$ phosphor.

The standard crystal structure used for structure analysis of the $K_3SiF_7:Mn^{4+}$ phosphor is based on ICSD (Inorganic Crystal Structure Database). The crystal structure of $K_3SiF_7$:$Mn^{4+}$ phosphor was analyzed with reference to conventional documents of $K_3SiF_7$ used as a matrix. The lattice constants of the $K_3SiF_7$:$Mn^{4+}$ phosphor were a=b=7.72484(6) Å, c=5.55496(6) Å, and α=β=γ=90°, which indicates that the $K_3SiF_7$:$Mn^{4+}$ phosphor has a tetragonal crystal structure.

The following Table 8 briefly shows locations of characteristic peaks, lattice constants and crystal structures of respective phosphors, determined using a built-in program of XRD equipment. Five peaks having a higher intensity at 2θ in the XRD pattern were selected as the characteristic peaks shown in Table 8 below.

In addition, XRD analysis results of the $K_3SiF7$:$Mn^{4+}$ phosphor (FIG. 4), the $(NH_4)_3SiF_7$:$Mn_x^{4+}$ phosphor (FIG. 5), the $(NH_4)_3GeF_7$:$Mn_x^{4+}$ phosphor (FIG. 6) and the $Rb_2KSiF_7$:$Mn_x^{4+}$ phosphor (FIG. 7) are each shown in FIGS. 4 to 7.

TABLE 8

| Composition formula | Characteristic peak (2θ, degree) | Lattice constants (Å) | | | Structure |
|---|---|---|---|---|---|
| | | a | b | c | |
| $K_3SiF_7$:$Mn^{4+}_{0.03}$ | 28.06, 32.70, 36.69, 41.62, 46.51 | 7.74 | 7.74 | 5.56 | Tetragonal |
| $(NH_4)_3SiF_7$:$Mn^{4+}_{0.02}$ | 15.57, 21.79, 26.90, 31.45, 39.71 | 8.04 | 8.04 | 5.85 | Tetragonal |
| $(NH_4)_3GeF_7$:$Mn^{4+}_{0.05}$ | 15.25, 21.31, 30.78, 26.31, 43.40 | 8.21 | 8.21 | 5.98 | Tetragonal |
| $Rb_2KSiF_7$:$Mn^{4+}_{0.04}$ | 27.45, 32.09, 36.00, 40.57, 45.38 | 7.88 | 7.88 | 5.72 | Tetragonal |

Test Example 2: Analysis of Optical Properties of Phosphors

In Test Example 2, the optical properties of manufactured phosphors were analyzed. An emission wavelength was analyzed by emitting 450 nm excitation light using a light-emission spectrometer (Perkin-Elmer Photoluminescence).

Emission spectrums of a $K_3SiF_7$:$Mn^{4+}_{0.03}$ phosphor (FIG. 8), a $K_3TiF_7$:$Mn^{4+}_{0.03}$ phosphor (FIG. 9), a $(NH_4)_3SiF_7$:$Mn_x^{4+}_{0.02}$ phosphor (FIG. 10), a $(NH_4)_3GeF_7$:$Mn_x^{4+}_{0.05}$ phosphor (FIG. 11), and a $(Rb_2K)_2SiF_6$:$Mn^{4+}_{0.04}$ phosphor (FIG. 12) are shown in FIGS. 8 to 12. In FIG. 8 to FIG. 12, the emission spectrum of the $A_2MF_6$:$Mn^{4+}$ phosphor used as a raw material is further shown, so that the position of the central wavelength is compared with the raw material phosphor.

In addition, the following Table 9 briefly shows the central wavelengths of emission spectra shown in FIGS. 8 to 11.

TABLE 9

| Item | | Composition formula | Central wavelength of main emission (nm) | Shift of central wavelength (nm) |
|---|---|---|---|---|
| Example 14 | Target phosphor | $K_3SiF_7$:$Mn^{4+}$ | 632 | −2 |
| | Raw material phosphor | $K_2SiF_6$:$Mn^{4+}$ | 634 | |
| Example 46 | Target phosphor | $K_3TiF_7$:$Mn^{4+}$ | 629 | −6 |
| | Raw material phosphor | $K_2TiF_6$:$Mn^{4+}$ | 633 | |
| Example 68 | Target phosphor | $(NH_4)_3SiF_7$:$Mn^{4+}$ | 632 | −2 |
| | Raw material phosphor | $(NH_4)_2SiF_6$:$Mn^{4+}$ | 634 | |
| Example 75 | Target phosphor | $(NH_4)_3GeF_7$:$Mn^{4+}$ | 633 | −2 |
| | Raw material phosphor | $(NH_4)_2GeF_6$:$Mn^{4+}$ | 635 | |
| Example 89 | Target phosphor | $Rb_2KSiF_7$:$Mn^{4+}$ | 631 | −1 |
| | Raw material phosphor | $(Rb_2K)_2SiF_6$:$Mn^{4+}$ | 632 | |

As can be seen from FIGS. 8 to 12 and Table 9, the metal fluoride phosphors of the present invention are excited at a wavelength of 450 nm and emit light with a central emission wavelength of 610 to 670 nm. Accordingly, the metal fluoride phosphors of the present invention can be useful in manufacturing white LEDs having a high color rendering index.

Test Example 3: Determination of Decay Times of Phosphors

In the present Test Example 3, decay times of the manufactured phosphors were evaluated. Emission measurement over time was carried out using a YAG laser analyzer, a 355 nm light source was used and analysis was carried out using a charge-coupled device sensor that can detect to 10 ns.

Figure 13:
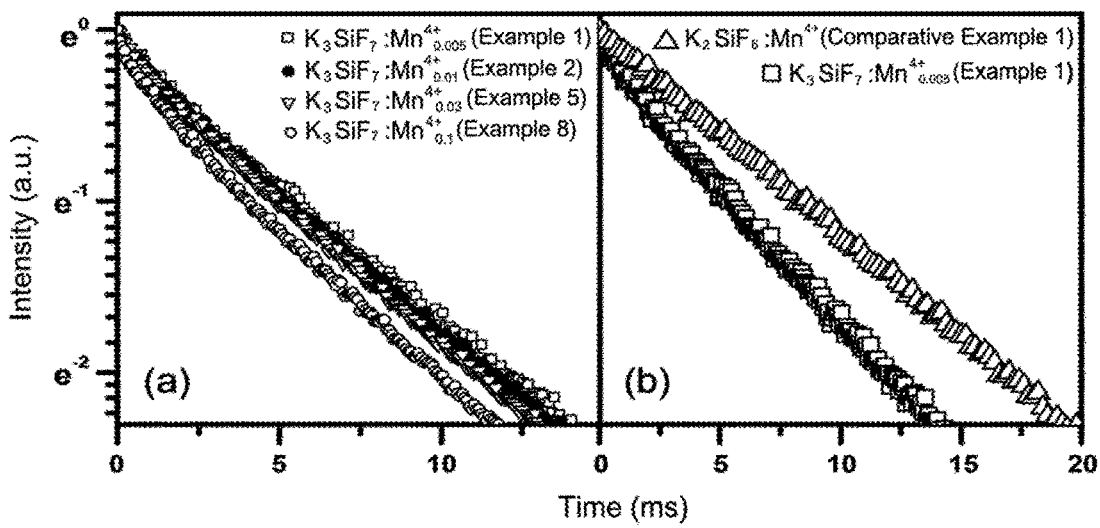
FIG. 13 shows comparison results of decay times of phosphors.

FIG. 13 shows comparison results of decay time with increasing concentration of manganese (Mn) contained as an activator in a $K_3SiF_7$:$Mn^{4+}$ phosphor. That is, the phosphors manufactured in Examples 1, 2, 5 and 8 are $K_3SiF_7$:$Mn^{4+}$ phosphors that are manufactured from a $K_2MnF_6$ manganese raw material as an activator in an increasing amount in the order of 0.005, 0.01, 0.03 and 0.1 g with respect to 1 g of the $K_2SiF_6$ matrix raw material.

As can be seen from FIG. 13A, the decay times of the phosphors of Examples 1, 2, 5 and 8 are gradually shortened in the order of 13.9, 13.6, 12.9 and 11.7 ms, respectively. That is, as content of the activator increases under the same content of the phosphor, decay time of the phosphor decreases.

In addition, as can be seen from FIG. 13B, the $K_2SiF_6$:$Mn^{4+}$ phosphor used as raw material has a decay time of 17.3 ms, while the $K_3SiF_7$:$Mn^{4+}$ phosphor manufactured in Example 1 has a short decay time, which can be useful for manufacturing light sources that are beneficial for the display or lighting industry.

Test Example 4: Imaging and Electron Microscopy of Phosphor Powders

Figure 14:
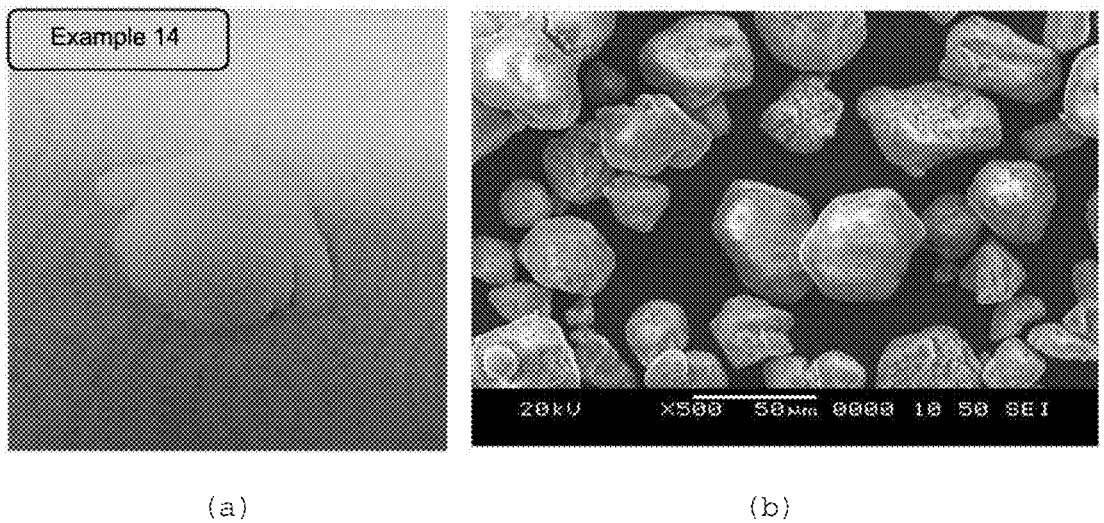
FIG. 14 is an image of a $K_3SiF_7$:$Mn^{4+}$ phosphor.
Figure 15:
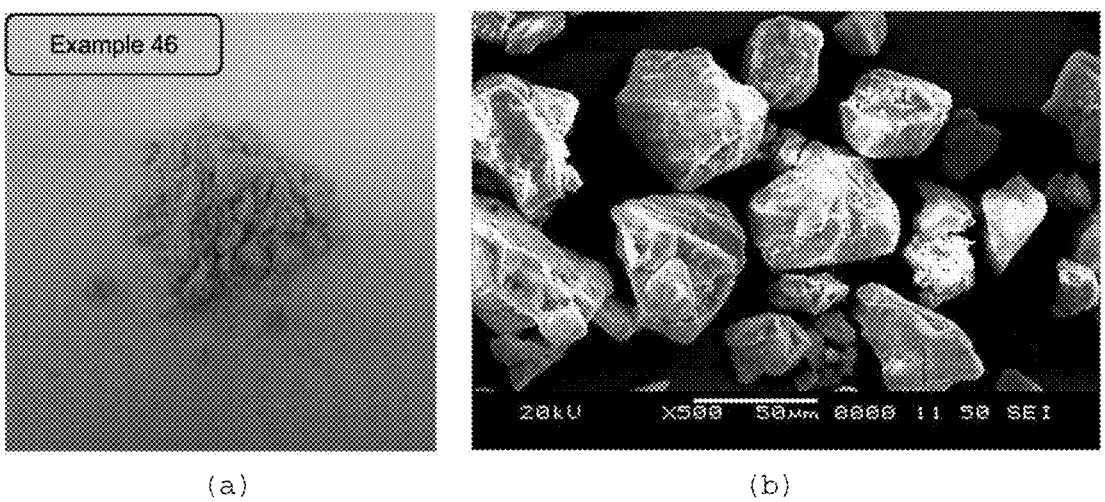
FIG. 15 is an image of a $K_3TiF_7$:$Mn^{4+}$ phosphor.
Figure 16:
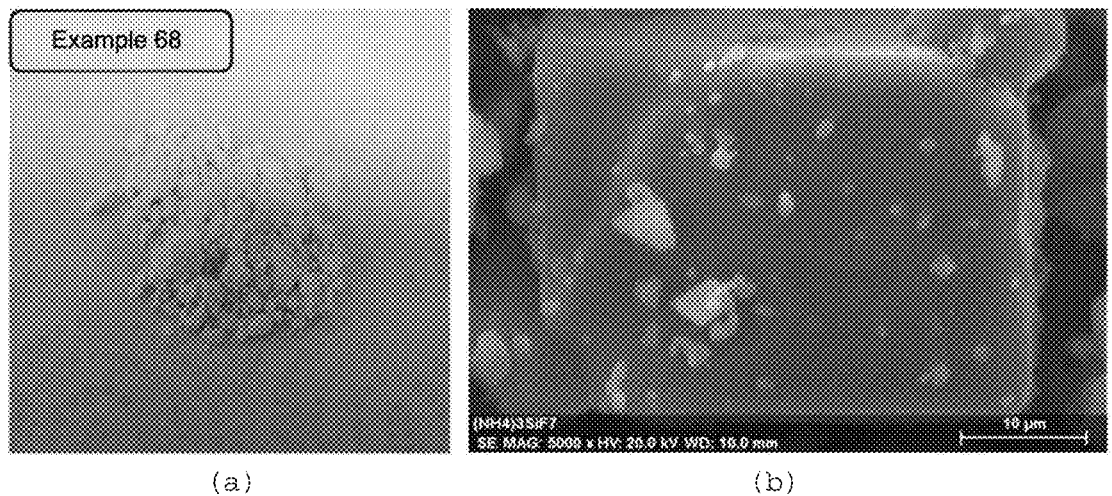
FIG. 16 is an image of a $(NH_4)_3SiF_7$:$Mn_x^{4+}$ phosphor.
Figure 17:
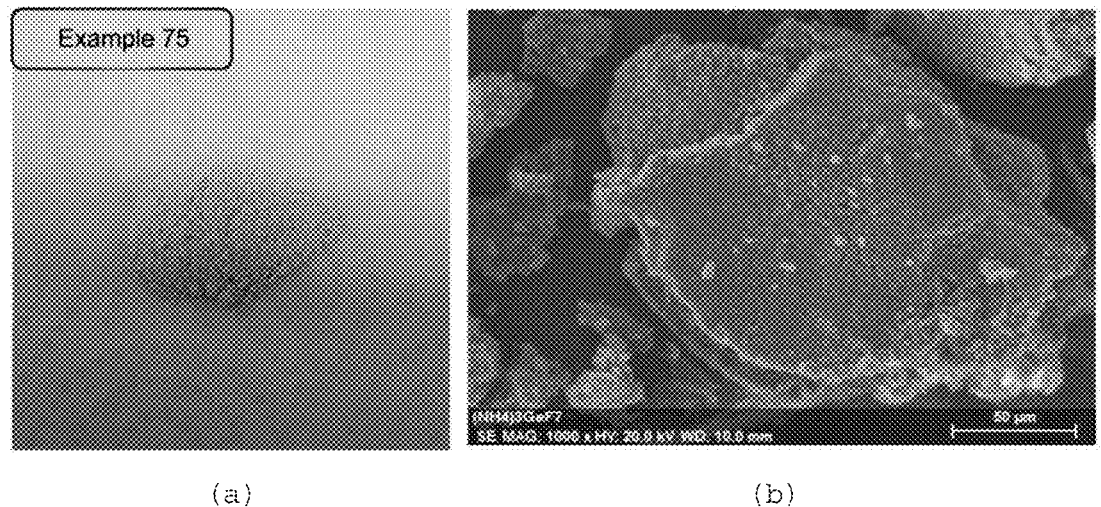
FIG. 17 is an image of a $(NH_4)_3GeF_7$:$Mn_x^{4+}$ phosphor.
Figure 18:
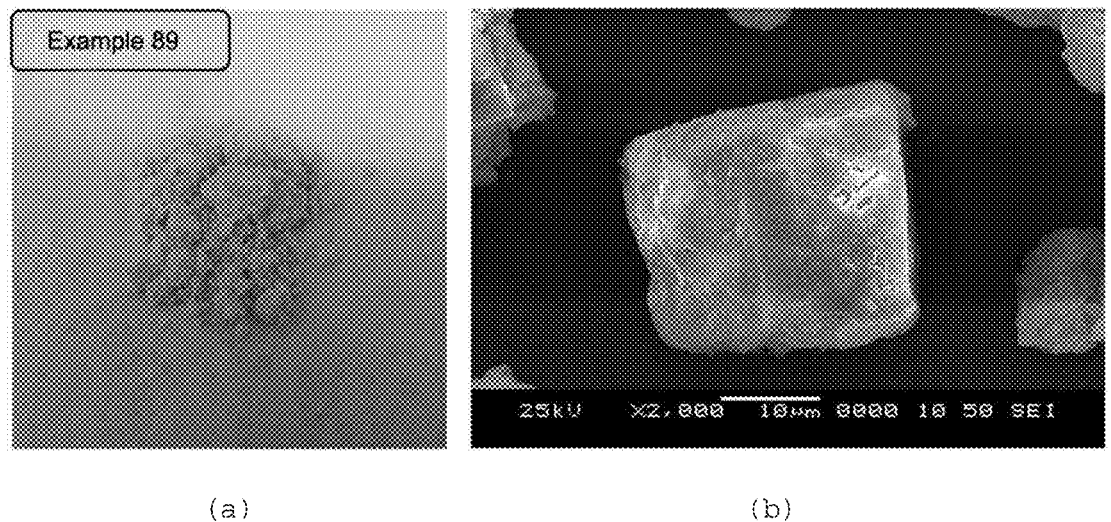
FIG. 18 is an image of a $Rb_2KSiF_7$:$Mn_x^{4+}$ phosphor.

In the present Test Example 4, powderization or microstructures of the manufactured phosphors were compared. Images and electron micrographs (500×) of powders of the $K_3SiF_7$:$Mn^{4+}_{0.03}$ phosphor manufactured in Example 14 (FIG. 14), the $K_3TiF_7$:$Mn^{4+}_{0.03}$ phosphor manufactured in Example 46 (FIG. 15), the $(NH_4)_3SiF_7$:$Mn_x^{4+}_{0.02}$ phosphor manufactured in Example 68 (FIG. 16), the $(NH_4)_3GeF_7$:$Mn_x^{4+}{}_{0.05}$ phosphor manufactured in Example 75 (FIG. 17), and the $Rb_2KSiF_7$:$Mn_x^{4+}{}_{0.04}$ phosphor manufactured in Example 89 (FIG. 18) are each shown in FIGS. 14 to 18.

As can be seen from FIGS. 14 to 18, the phosphors manufactured in the present invention were synthesized well in the form of powders having a uniform particle size.

Test Example 5: Determination of Performance of White Light Emitting Diodes

In the present Test Example 5, white light emitting diodes manufactured using the phosphors according to the present invention were evaluated.

A mixture of 30 mg of a red phosphor and 0.2 g of a silicone resin was applied to the surfaces of blue light emitting diode (emission wavelength: 450 nm) chips, and cured at 150° C. for 30 minutes to manufacture white light emitting diodes. The performance of white light emitting diodes manufactured by the method described above was evaluated by luminescent analysis and results are shown in FIG. 19.

Figure 19:
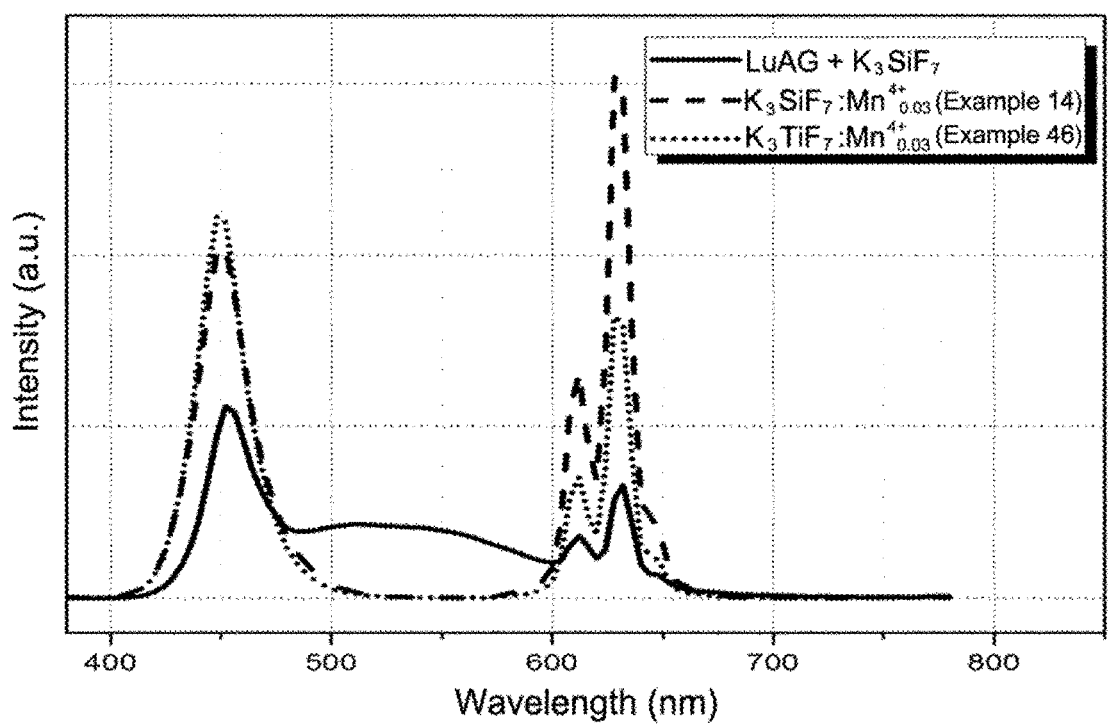
FIG. 19 shows evaluation results of luminous performance of white LEDs manufactured using the metal fluoride red phosphor.

FIG. 19 shows results of comparative analysis in terms of light emission properties between a generally well-known LuAG green-yellow phosphor and the metal fluoride phosphors according to the present invention. The phosphors of the present invention are the $K_3SiF_7$:$Mn^{4+}{}_{0.03}$ phosphor manufactured in Example 14 and the $K_3TiF_7$:$Mn^{4+}{}_{0.03}$ phosphor manufactured in Example 46.

As can be seen from FIG. 19, the metal fluoride phosphors manufactured according to the present invention have a narrower full width at half maximum (FWHM) than the LuAG green-yellow phosphor. The narrow full width at half maximum means that the color sensitivity is similar to that of a human. When white luminescent diodes are manufactured using the metal fluoride phosphor in conjunction with the green-yellow phosphor, a lack of color reproduction in red regions can be compensated for.

The invention claimed is:

1. A metal fluoride red phosphor having a composition of $Rb_2KSiF_7$:$Mn_x^{4+}$, where x satisfies $0<x\leq0.15$, and a tetragonal crystal structure comprising, as a main phase, a phase having a diffraction peak with a relative intensity of 5% or higher within a range of Bragg's angle (2θ) of 27.45±0.05°, 32.09±0.05°, 36.00±0.05°, 40.57±0.05° and 45.38±0.05° in a powder X-ray diffraction pattern.

2. The metal fluoride red phosphor according to claim 1, wherein the excitation wavelength is 365 to 480 nm.

3. The metal fluoride red phosphor according to claim 1, wherein the central emission wavelength is 610 to 670 nm.

4. A white light emitting element comprising the metal fluoride red phosphor according to claim 1.

5. The white light emitting element according to claim 4, wherein the metal fluoride red phosphor further comprises an ordinary phosphor selected from a YAG:Ce phosphor and a $L_2SiO_4$:Eu phosphor, wherein L is an alkaline earth metal selected from Mg, Ca, Sr and Ba.

* * * * *